(12) United States Patent
Bresson

(10) Patent No.: US 11,331,767 B2
(45) Date of Patent: May 17, 2022

(54) PADS FOR CHEMICAL MECHANICAL PLANARIZATION TOOLS, CHEMICAL MECHANICAL PLANARIZATION TOOLS, AND RELATED METHODS

(71) Applicant: Micron Technology, Inc., Boise, ID (US)

(72) Inventor: James Bresson, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/265,311

(22) Filed: Feb. 1, 2019

(65) Prior Publication Data

US 2020/0246937 A1 Aug. 6, 2020

(51) Int. Cl.
*B24B 37/26* (2012.01)
*H01L 21/306* (2006.01)

(52) U.S. Cl.
CPC ........ *B24B 37/26* (2013.01); *H01L 21/30625* (2013.01)

(58) Field of Classification Search
CPC .... B24B 37/26; B24B 37/22; H01L 21/30625
USPC ....................................................... 438/692
See application file for complete search history.

(56) References Cited

U.S. PATENT DOCUMENTS

| | | | |
|---|---|---|---|
| 5,441,598 A | 8/1995 | Yu et al. | |
| 5,527,424 A | 6/1996 | Mullins | |
| 5,679,065 A | 10/1997 | Henderson | |
| 6,121,143 A | 9/2000 | Messner et al. | |
| 6,123,612 A * | 9/2000 | Goers | B24B 53/017 451/540 |
| 6,224,465 B1 | 5/2001 | Meyer | |
| 6,332,832 B1 | 12/2001 | Suzuki | |
| 6,612,917 B2 | 9/2003 | Bruxvoort | |
| 6,786,810 B2 | 9/2004 | Muilenburg et al. | |
| 6,817,926 B2 * | 11/2004 | Kollodge | B24D 11/00 451/36 |
| 6,910,947 B2 | 6/2005 | Paik | |
| 7,163,444 B2 | 1/2007 | Kollodge et al. | |
| 7,169,030 B1 | 1/2007 | Kulp | |
| 7,238,093 B1 | 7/2007 | Sakamoto et al. | |
| 7,329,171 B2 | 2/2008 | Goetz | |

(Continued)

FOREIGN PATENT DOCUMENTS

| | | |
|---|---|---|
| CN | 1217769 C | 5/1999 |
| CN | 1929956 A | 3/2007 |
| JP | 526554 B | 4/2003 |

OTHER PUBLICATIONS

Taiwanese Office Action with Search Report for Application No. 109102698, dated Jan. 26, 2021, 15 pages.

(Continued)

*Primary Examiner* — Binh X Tran
(74) *Attorney, Agent, or Firm* — TraskBritt

(57) ABSTRACT

A pad for chemical mechanical planarization comprises a material having a major surface, and asperities extending from the major surface, a ratio between a length and a width of each of the asperities greater than about 2:1, and an included angle between a leading surface of at least some asperities and the major surface greater than about 90°. Related pads, tools for chemical mechanical planarization, and related methods are also disclosed.

31 Claims, 8 Drawing Sheets

(56) References Cited

U.S. PATENT DOCUMENTS

| | | |
|---|---|---|
| 7,828,634 B2 | 11/2010 | Jiang et al. |
| 8,377,158 B2 | 2/2013 | Plamgren et al. |
| 8,821,214 B2 | 9/2014 | Joseph |
| 8,951,099 B2 * | 2/2015 | Wu ..................... B24B 53/007 451/443 |
| 9,162,340 B2 | 10/2015 | Joseph et al. |
| 9,956,664 B2 | 5/2018 | Lehuu et al. |
| 10,071,461 B2 | 8/2018 | Lehuu et al. |
| 10,071,459 B2 | 9/2018 | Lugg et al. |
| 2004/0003895 A1 | 1/2004 | Amano et al. |
| 2010/0003904 A1 * | 1/2010 | Duescher ............... B24B 37/26 451/259 |
| 2013/0059506 A1 | 3/2013 | Qian et al. |
| 2013/0102231 A1 | 4/2013 | Joseph et al. |
| 2013/0225052 A1 * | 8/2013 | Song .................... B24B 53/017 451/443 |
| 2017/0008143 A1 | 1/2017 | Minami et al. |
| 2018/0281148 A1 | 10/2018 | Lehuu et al. |
| 2018/0366333 A1 * | 12/2018 | Nguyen ............... C09K 3/1409 |

OTHER PUBLICATIONS

Chinese First Office Action for Application No. 202010079308.5, dated Jun. 3, 2021, 16 pages.
Taiwanese Rejection Decision for Application No. 109102698, dated Jun. 23, 2021, 10 pages.
Taiwanese Third Office Action for Application No. 109102698, dated Oct. 13, 2021, 17 pages.

* cited by examiner

PADS FOR CHEMICAL MECHANICAL PLANARIZATION TOOLS, CHEMICAL MECHANICAL PLANARIZATION TOOLS, AND RELATED METHODS

TECHNICAL FIELD

Embodiments disclosed herein relate to pads for chemical mechanical planarization, to tools including the pads, and to related methods. More particularly, embodiments of the disclosure relate to pads for chemical mechanical planarization, the pads including asperities extending from a major surface thereof and shaped and configured to planarize surfaces of a wafer by one or both of a shearing action and a rubbing action. Embodiments of the disclosure are also directed to related tools including the pads, and related methods.

BACKGROUND

Fabrication of semiconductor devices, memory cells, and electronic systems includes patterning of various features, such as conductive lines, transistors, electrodes, conductive contacts (e.g., conductive plugs), and other features. At various stages during the fabrication process, materials may be deposited on the semiconductor device (e.g., the wafer) being fabricated. Patterning of such material may include removal of excess materials from surfaces of the semiconductor device. In some instances, surfaces of the semiconductor device are planarized to form a uniform surface to ensure alignment of features and maintenance of critical dimensions during further processing acts.

Chemical mechanical planarization, which may also be characterized as chemical mechanical polishing (CMP), is a technique used to planarize, polish, or clean workpieces, such as semiconductor devices, during fabrication thereof. In a conventional CMP process, a rotatable wafer carrier, or polishing head, is mounted on a carrier assembly. The wafer carrier head holds the wafer and positions the wafer in contact with a polishing layer of a polishing pad that is mounted on a rotatable table, which may be characterized as a platen, of a CMP tool. The polishing pad includes a microstructure of pores and randomly oriented asperities that facilitate removal of material from the wafer. The carrier assembly provides a normal force in the form of a controllable, applied pressure between the wafer and polishing pad. A fluid, which may comprise a slurry or other flowable medium, is dispensed onto the polishing pad and is drawn into a narrow gap between the wafer and the polishing layer while the polishing pad and wafer are moved relative to one another. Materials removed from the wafer are removed from between the wafer and the polishing pad through channels (also referred to as microchannels or grooves) in the polishing pad.

As the polishing pad moves relative to the wafer, the wafer follows a typically annular polishing track, wherein the wafer's surface directly contacts the polishing layer of the polishing pad. The surface of the wafer is polished and planarized by chemical and mechanical action of the polishing pad and the fluid medium on the surface of the wafer. Over time, the surface of the polishing pad wears, smoothing the microstructure of the porous polishing pad structure, a process referred to in the art as "glazing." In addition, debris removed from the wafer surface during the CMP process may clog surface voids and microchannels of the polishing pad through which the fluid medium flows. The clogged surface voids and microchannels reduces the polishing rate of the CMP process and may result in non-uniform polishing between wafers (wafer to wafer non-uniformity (WTWNU)) and between different portions of a single wafer (within wafer non-uniformity (WIWNU)). Due to the adverse effects of glazing and clogging of surface voids, conventional polishing pads require periodic surface conditioning (also referred to as "dressing") to maintain a surface suitable for polishing the wafer. Conditioning the polishing pad includes contacting the surfaces of the polishing pad with a conditioning disk including impregnated abrasive particles, such as diamond particles. Although conditioning the polishing pad may create a new polishing surface, the new polishing surface may not exhibit a uniform distribution of pores or surface topography and may exhibit irregular removal rates, reducing a planarity of the polished wafer.

DETAILED DESCRIPTION

Figure 1:
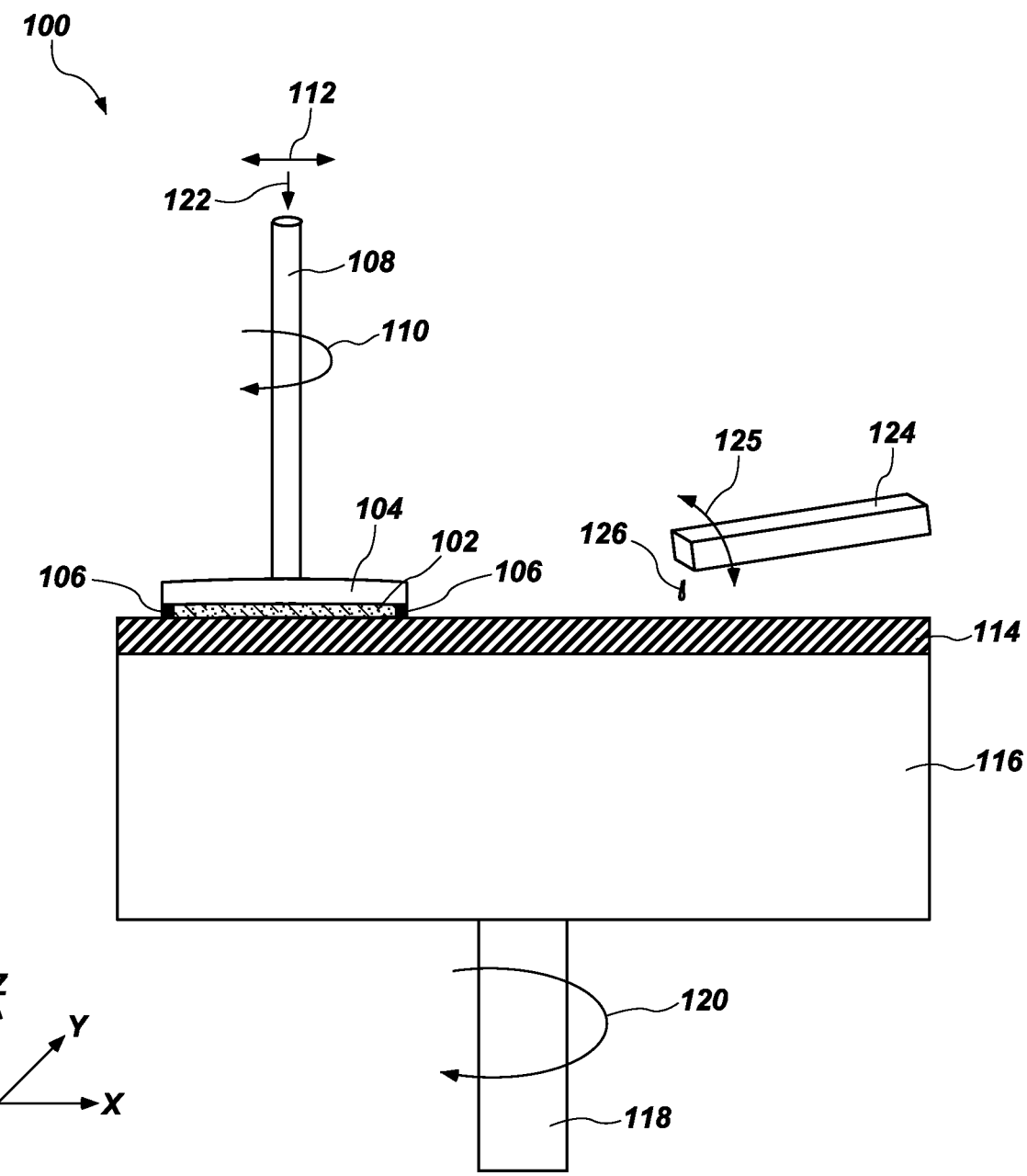
FIG. 1 is a simplified schematic view of a tool for chemical mechanical planarization, in accordance with embodiments of the disclosure.

The illustrations included herewith are not meant to be actual views of any particular chemical mechanical planarization tools or pads, but are merely idealized representations that are employed to describe embodiments herein. Elements and features common between figures may retain the same numerical designation except that, for ease of following the description, for the most part, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a chemical mechanical planarization (CMP) tool, a pad for such a CMP tool, or a complete description of a process flow for fabricating such CMP tools or pads. Only those process acts and structures necessary to understand the embodiments described herein are described in detail below. Additional acts to form a complete CMP tool or pad, may be performed by conventional techniques.

As used herein, the terms "chemical mechanical planarization" and "chemical mechanical polishing" are used interchangeably.

As used herein, the terms "longitudinal," "vertical," "lateral," and "horizontal" are in reference to a major plane of a substrate (e.g., base material, base structure, base construction) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

According to embodiments described herein, a chemical mechanical planarization tool includes a pad including asperities extending from a major surface of the pad in a direction that is substantially transverse to a direction of the major surface. The pad may further include pores located between asperities of the pad. The pores may extend into the major surface. One or more of the asperities may be oriented, shaped, and configured to planarize a wafer by a shearing action with which the pad is brought into contact. Others of the one or more asperities of the pad may be oriented, shaped, and configured to polish (e.g., rub) one or more surfaces of the wafer in a polishing action. In some embodiments, at least some of the asperities may include an upper surface (located distal from a base of the respective asperity), wherein the upper surface is oriented at an acute (less than 90°) relief angle relative to the major surface. The asperities may have a leading surface oriented at a leading angle with respect to the major surface and a trailing surface oriented at a trailing angle with respect to the major surface. As used in this context, "leading" means directionally leading in a direction of asperity movement during rotation of the pad, whereas "trailing" means directionally trailing in a direction of asperity movement during rotation of the pad. The leading angle may be tailored to increase a stiffness and, thus, durability of the asperity and to optimize contact between the pad and the wafer. In use and operation, the leading angle may facilitate removal of material from a wafer by a shearing action effected by a shearing edge at a distal extent of the leading surface of the asperity.

The asperities may be oriented on the pad at a skew angle, which may be defined as an angle between a longitudinal axis of the asperity and a radial direction of the pad at the location where the particular asperity is located. Accordingly, the pad may include asperities that are not substantially aligned (parallel) with each other. The skew angle may be tailored to at least one of adjust a material removal rate of the pad, to adjust the shearing action of the asperities, or to adjust a stiffness of the asperities. Each of the asperity height, asperity width, asperity length, relief angle, skew angle, leading angle, trailing angle, asperity spacing (pitch), asperity overlap, and pad thickness may be tailored to affect one or more of a length scale of planarization of the wafer (an effective distance over which the pad may effectively planarize surfaces of the wafer in use and operation), a removal rate achieved by the pad, an amount of interaction between the upper surface of the asperities and the wafer, or a rigidity of the asperities.

Semiconductor wafers polished with the pad including the asperities, according to embodiments described herein, may exhibit improved surface planarity, reduced within-wafer non-uniformity, and reduced wafer to wafer non-uniformity.

FIG. 1 is a simplified schematic view of a chemical mechanical planarization (CMP) tool 100. The CMP tool 100 may be configured and operated to remove material from a surface of a wafer 102 in at least one of a planarizing or polishing operation. The wafer 102 may be held by a carrier 104 which may be configured and operated to hold the wafer 102 in place during rotation of the wafer 102. A retaining ring 106 may circumferentially surround the wafer 102 to hold the wafer 102 in place during operating of the CMP tool 100. The retaining ring 106 may be configured to maintain the wafer 102 in a position aligned with the surface of a pad 114. In some embodiments, the retaining ring 106 is integral with the carrier 104. In some embodiments, a backing material or backing pad may be located between the wafer 102 and the carrier 104. The retaining ring 106 may securely position the wafer 102 under the carrier 104 during CMP processes. In addition, the retaining ring 106 may facilitate uniform material removal, such as proximate a periphery of the wafer 102.

The wafer 102 may comprise a number of in-process semiconductor devices, such as one or more of semiconductor devices including arrays of memory cells, logic circuits, or processor circuits, as known in the art. The semiconductor devices may include active and passive circuit elements as well as other features, such as, for example, memory cells, transistors, capacitors, electrically conductive lines (e.g., word lines, digit lines, sense lines, bit lines, data lines), conductive contacts (e.g., conductive plugs), redistribution lines, and other components of circuitry associated with, for example, memory or other semiconductor devices. Some of the patterns and features of the wafer 102 may have a length scale (e.g., pitch in a particular direction) falling within a certain range and other patterns and features of the wafer 102 may have a length scale (e.g., pitch in a particular direction) falling within another range. By way of nonlimiting example, various features of the wafer 102 may be spaced apart (e.g., separated) from each other by an edge to edge, or center to center, distance, which may be characterized as a "pitch" within a range from about 10 nm to about 200 nm, such as from about 10 nm to about 20 nm, from about 20 nm to about 50 nm, from about 50 nm to about 100 nm, or from about 100 nm to about 200 nm. Other features of the wafer 102 may be spaced from each other by an edge to edge, or center to center, distance (e.g., a pitch), within a range from about 1 µm to about 100 µm, such as from about 1 µm to about 5 µm, from about 5 µm to about 10 µm, from about 10 µm to about 20 µm, from about 20 µm to about 40 µm, from about 40 µm to about 60 µm, from about 60 µm to about 80 µm, or from about 80 µm to about 100 µm. According to embodiments described herein, the pad 114 may be used to planarize various portions of the wafer 102 including different features exhibiting a different pitch from one another.

The wafer 102 may include exposed surfaces (surfaces to be brought into contact with the pad 114) including various compositions. For example and not by way of limitation, exposed surfaces of the wafer 102 may include at least one of silicon, dielectric materials (e.g., silicon dioxide, phosphosilicate glass, borosilicate glass, fluorosilicate glass), metal oxides (e.g., titanium oxide, hafnium oxide, zirconium oxide, aluminum oxide, tungsten oxide, ruthenium oxide, iridium oxide), metal nitrides (e.g., tungsten nitride, titanium nitride, tantalum nitride, titanium aluminum nitride), metals (e.g., at least one of tungsten, titanium, nickel, platinum, ruthenium, rhodium, aluminum, copper, molybdenum, gold, iridium), metal silicides, metal carbides, a conductively-doped semiconductor material (e.g., conductively-doped silicon, conductively-doped germanium, conductively-doped silicon germanium), polysilicon, or another material.

In use and operation, the wafer 102 may be rotated relative to a rotational axis 108, as indicated by arrow 110. The rotational axis 108 may comprise, for example, a shaft in operable communication with a drive (e.g., motor) for rotating the carrier 104 and the wafer 102. In some embodiments, the carrier 104 may be configured to move in the lateral direction, as indicated by arrow 112. In other words, the carrier 104 may be configured to move in one or both of the x-direction and the y-direction.

The pad 114 may be secured to a platen 116. In some embodiments, a subpad may be located between the pad 114 and the platen 116. The platen 116 may be operably coupled to a drive 118, which may be configured to impart rotational motion to the platen 116, as indicated by arrow 120. In use and operation, one or both of the wafer 102 and the pad 114 may be rotated with respect to the other of the wafer 102 and the pad 114 to provide relative motion between the wafer 102 and the pad 114.

In some embodiments, the pad 114 may be rotated in a direction (e.g., clockwise or counterclockwise) at a rate within a range from about 30 rotations per minute (RPM) to about 150 RPM, such as from about 30 RPM to about 45 RPM, from about 45 RMP to about 60 RPM, from about 60 RPM to about 75 RPM, from about 75 RPM to about 100 RPM, from about 100 RPM to about 125 RPM, or from about 125 RPM to about 150 RPM. In some embodiments, the pad 114 is rotated at a rate within a range from about 45 RPM to about 125 RPM. The wafer 102 may be rotated in a direction (e.g., clockwise or counterclockwise) at a rate within a range from about 30 RPM to about 150 RPM, such as from about 30 RPM to about 45 RPM, from about 45 RMP to about 60 RPM, from about 60 RPM to about 75 RPM, from about 75 RPM to about 100 RPM, from about 100 RPM to about 125 RPM, or from about 125 RPM to about 150 RPM. In some embodiments, the wafer 102 is rotated at a rate within a range from about 45 RPM to about 125 RPM. In some embodiments, the pad 114 and the wafer 102 are rotated in the same direction. In some embodiments, the pad 114 and the wafer 102 are rotated at substantially the same rate. In some such embodiments, a relative velocity between the surface of the pad 114 and the surface of the wafer 102 may be substantially uniform along a surface of the wafer 102. In other words, the motion of the pad 114 relative to the wafer 102 may be substantially uniform across the surface of the wafer 102. In other embodiments, the pad 114 and the wafer 102 are not rotated in the same direction. By way of nonlimiting example, the pad 114 and the wafer 102 may be rotated in opposite directions (e.g., clockwise and counterclockwise).

The pad 114 may comprise a polymeric material. By way of nonlimiting example, the pad 114 may comprise a thermoplastic material such as at least one of polypropylene, polyethylene, polycarbonate, polyurethane (e.g., a cross-linked polyurethane foam material), polytetrafluoroethylene, polyethylene tetraphthalate, polyethylene oxide, polysulphone, polyetherketone, polyetheretherketone (PEEK), a polyimide, poly(vinylalcohol) (PVA), a nylon material, polyphenylene sulfide, polystyrene, polyoxymethylene plastic, a thermoset material such as a polyurethane, epoxy resin, a phenoxy resin, a phenolic resin, a melamine resin, a polyimide, and a urea-formaldehyde resin. In some embodiment, the polishing pad 114 comprises a polymer. In some embodiments, the pad 114 comprises a polyurethane material.

In use and operation, a controlled, downward (i.e., normal) force, indicated by arrow 122, may be applied to the wafer 102 as the wafer 102 is moved relative to the pad 114. A fluid medium 126 may be provided on the polishing pad 114 via a dispenser in the form of nozzle 124 during operation of the CMP tool 100. The nozzle 124 may be configured to move laterally (in the x-direction, the y-direction, or both), such as indicated by arrow 125.

The composition of the fluid medium 126 may vary depending on the material composition of the materials on the surface of the wafer 102 and the desired properties of the wafer 102. The fluid medium 126 may comprise at least one of water (e.g., deionized water), phosphoric acid ($H_3PO_4$), a peroxide, a carboxylic acid, an inorganic acid, ammonia, one or more surfactants, one or more types of particles, and another material. The particles may comprise, for example, at least one of metal oxide particles (e.g., silica ($SiO_2$), ceria ($CeO_2$), alumina ($Al_2O_3$), titanium dioxide ($TiO_2$), zirconium oxide (ZrO), other oxide particles), silicon carbide (SiC), silicon nitride ($Si_3N_4$), and aluminum nitride (AlN). In other embodiments, the fluid medium 126 comprises one or more materials suitable for chemical buffing applications. In some embodiments, the fluid medium 126 comprises one or both of silica particles and ceria particles. In some embodiments, the fluid medium 126 comprises deionized water. In some such embodiments, the fluid medium 126 may not include particles. It is notable that embodiments of pads 114 of the present disclosure, by virtue of the shearing actions effected by pad asperities, may reduce or eliminate the need for particulate matter in the fluid medium for some operations, as is required by conventional polishing pads.

By way of nonlimiting example, in some embodiments, the fluid medium 126 may comprise a so-called abrasiveless composition and may comprise, for example, a wet etchant such as one or more of sulfuric acid, phosphoric acid, hydrochloric acid, hydrofluoric acid, ammonium fluoride, potassium hydroxide, ammonium hydroxide, hydrogen peroxide, sodium hydroxide, acetic acid, and another wet etchant. The fluid medium 126 may further comprise one or more chelating agents. In some such embodiments, the pad 114 may be used for removing metals (e.g., tungsten, titanium, nickel, platinum, ruthenium, rhodium, aluminum, copper, molybdenum, gold, iridium) from a surface by chemical mechanical planarization. Without being bound by any particular theory, it is believed that such metals may be removed by a combination of shearing action and chemical etching.

Figure 2A:
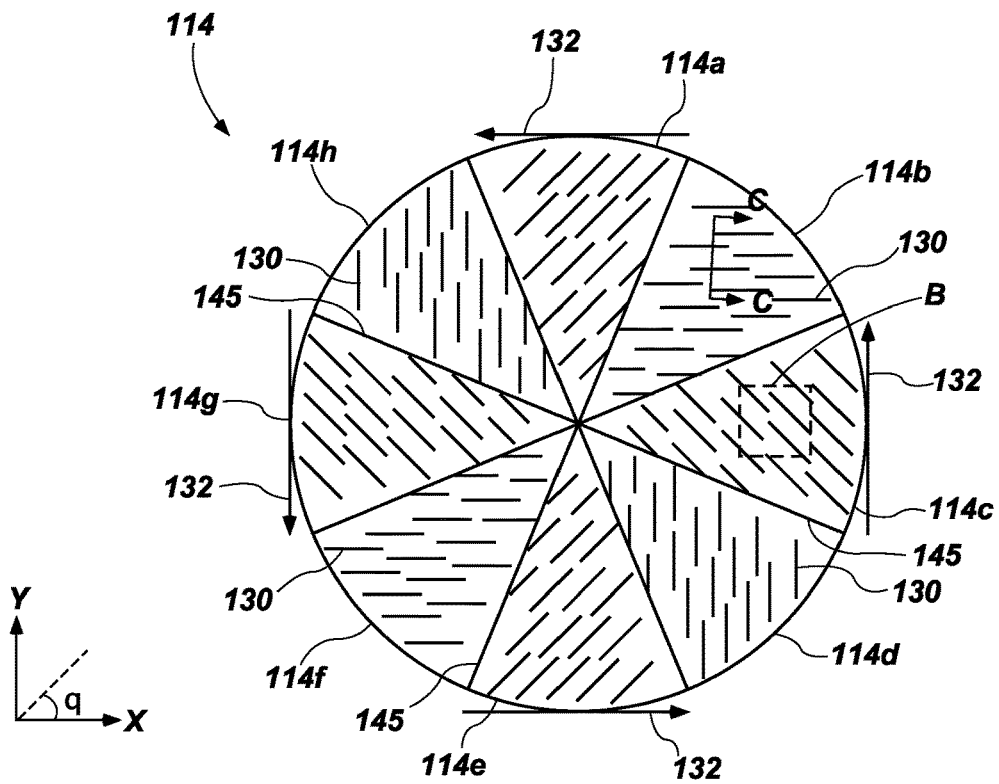
FIG. 2A is a simplified top down view of a pad for use in a chemical mechanical planarization tool, in accordance with embodiments of the disclosure.

FIG. 2A is a top down view of the pad 114 shown in FIG. 1. The pad 114 may include asperities 130 oriented on the pad 114. The asperities 130 may be arranged in a pattern on the pad 114. In some embodiments, the pad 114 may include segments 114a-114h, which may also be referred to as "slices" in some embodiments. In some embodiments, the pad 114 comprises a plurality of segments 114a-h, each segment 114a-114h having similarly oriented and patterned asperities 130. In some embodiments, each segment 114a-114h may be substantially the same as the other segments 114a-114h. Stated another way, if a first segment 114a is rotationally translated to overlie a second segment 114b, the first segment 114a and the second segment 114b would be substantially the same with similarly oriented asperities 130. In other embodiments, the asperities 130 may be randomly oriented on the polishing pad 114. In some embodiments, each segment 114a-114h has about a same number of asperities 130 as the other segments 114a-114h. In yet other embodiments, at least one of the segments 114a-114h may include a different number of asperities 130 than at least another of the segments 114a-114g.

The pad 114 may have a diameter within a range from about 100 mm to about 1,000 mm, such as from about 100 mm to about 250 mm, from about 250 mm to about 500 mm, from about 500 mm to about 750 mm, or from about 750 mm to about 1,000 mm. However, the disclosure is not so limited and the diameter of a given pad 114 may be different than those described above.

As illustrated in FIG. 2A, an angle θ may be defined as an angle between the x-axis and a line (radial line) extending from the center of the pad 114 toward a circumference of the pad 114 in a counterclockwise direction. For example, the angle θ may be equal to about 90° in the upward vertical direction, equal to about 180° in the left direction, and equal to about 270° in the downward direction in FIG. 2A. A tangent 132 of the pad 114 may change as the angle θ changes. In use and operation, the direction of the tangent 132 at a particular angle θ may be representative of a direction of motion of the pad 114 as the pad 114 is rotated by the drive 118 (FIG. 1). As one example, the direction of motion of the pad 114 in segment 114c may be upward in the view illustrated in FIG. 2A when the direction of motion of the pad 114 is in a counterclockwise direction in FIG. 2A.

Although FIG. 2A illustrates 8 segments 114a-114h, the disclosure is not so limited. In other embodiments, the pad 114 may include less than 8 segments 114a-114h (e.g., 4 segments, 5 segments, 6 segments, 7 segments) or may include more than 8 segments 114a-114h (e.g., 9 segments, 10 segments, 11 segments, 12 segments). In some embodiments, the pad 114 includes more than 8 segments 114a-114h, such as more than 12 segments 114a-114h, more than 18 segments 114a-114h, more than 24 segments 114a-114h, or more than 36 segments 114a-114h. As the number of segments 114a-114h increases, a relative angle between asperities 130 of adjacent segments 114a-114h may be reduced. In other words, as the number of segments 114a-114h increases, the uniformity of relative orientation of the asperities 130 proximate one another is increased. For example, referring to FIG. 2A, asperities 130 in a first segment 114a may be oriented at about 45° with respect to asperities in an adjacent second segment 114b. By way of comparison, if the pad 114 includes, for example, 16 segments 114a-114h, asperities 130 in the first segment 114a may be oriented at an angle of about 22.5° with respect to asperities 130 in an adjacent, second segment 114b.

In some embodiments, a longitudinal axis 134 (FIG. 2B) of asperities 130 at the same angle θ on the pad 114 may be substantially parallel. In other words, asperities 130 at the same angular orientation θ on the polishing pad 114 may be substantially parallel with each other. In some embodiments, asperities 130 within the same segment 114a-114h may be substantially parallel with each other (e.g., have substantially parallel longitudinal axes 134). The relative angle between asperities 130 at a first angular orientation $\theta_1$ and asperities 130 at a second angular orientation $\theta_2$ may be equal to about a difference between the first angular orientation $\theta_1$ and the second angular orientation $\theta_2$ (i.e., $\theta_1$-$\theta_2$). In other words, and only as an example, the relative angle between a longitudinal axis of an asperity 130 located on, for example, the x-axis, and longitudinal axis of an asperity 130 located on, for example, the y-axis, may be about 90°.

In some embodiments, the asperities 130 located within the same segment 114a-114h may be substantially parallel with each other and the asperities 130 located within different segments 114a-114h may be offset (angled) with respect to each other. In some embodiments, the asperities 130 in a first segment 114a-114h located about 180° from a second segment 114a-114h may be substantially parallel with each other. Stated another way, the asperities 130 in a pair of opposing segments 114a-114h may mirror one another. In yet other embodiments, asperities 130 within the same segment 114a-114h may not be substantially parallel with each other.

Accordingly, in some embodiments, the pad 114 comprises a number of segments 114a-114h. Each segment 114a-114h may include asperities 130 and may include, for example, a same number of asperities 130 as the other segments 114a-114h. Each segment 114a-114h may include asperities 130 that are substantially parallel with each other. The asperities 130 of each segment 114a-114h may include asperities 130 that are not substantially parallel (offset) with asperities 130 of at least some adjacent segments 114a-114h.

In FIG. 2A, the asperities 130 are oriented such that the fluid medium 126 and polishing byproducts (e.g., removed materials from the wafer 102) are directed outward when the pad 114 is rotated (e.g., in a counterclockwise direction, in a clockwise direction). In other embodiments, the asperities 130 are oriented such that the fluid medium 126 and the byproducts are directed inward. In some such embodiments, a portion of the fluid medium 126 may be recycled inwardly rather than directed to the outside of the pad 114.

A density of the asperities 130 may be within a range from about $10/cm^2$ to about $40,000/mm^2$, such as from about $10/cm^2$ to about $50/cm^2$, from about $50/cm^2$ to about $1/mm^2$, from about $1/mm^2$ to about $100/mm^2$, from about $100/mm^2$ to about $500/mm^2$, from about $500/mm^2$ to about $1,000/mm^2$, from about $1,000/mm^2$ to about $10,000/mm^2$, or from about $10,000/mm^2$ to about $40,000/mm^2$. In some embodiments, the density of the asperities 130 may be within a range from about $10/mm^2$ to about $500/mm^2$, such as from about $10/mm^2$ to about $25/mm^2$, from about $25/mm^2$ to about $50/mm^2$, from about $50/mm^2$ to about $75/mm^2$, from about $75/mm^2$ to about $100/mm^2$, from about $100/mm^2$ to about $200/mm^2$, from about $200/mm^2$ to about $300/mm^2$, from about $300/mm^2$ to about $400/mm^2$, or from about $400/mm^2$ to about $500/mm^2$.

In some embodiments, the pad 114 includes grooves (channels) 145. In some embodiments, the grooves 145 are located at boundaries between adjacent segments 114a-114h. The grooves 145 may facilitate flow of the fluid medium 126 (FIG. 1) between the wafer 102 (FIG. 1) and the pad 114. In addition, the grooves 145 may facilitate flow of debris from the wafer 102 away from an interface between the pad 114 and the wafer 102. The grooves 145 may extend into a surface of the pad 114 a distance within a range from about 250 µm to about 750 µm, such as from about 250 µm to about 500 µm, or from about 500 µm to about 750 µm, although the disclosure is not so limited. The presence of such channels may enhance fluid dynamics between the pad 114 and the wafer 102.

Figure 2B:
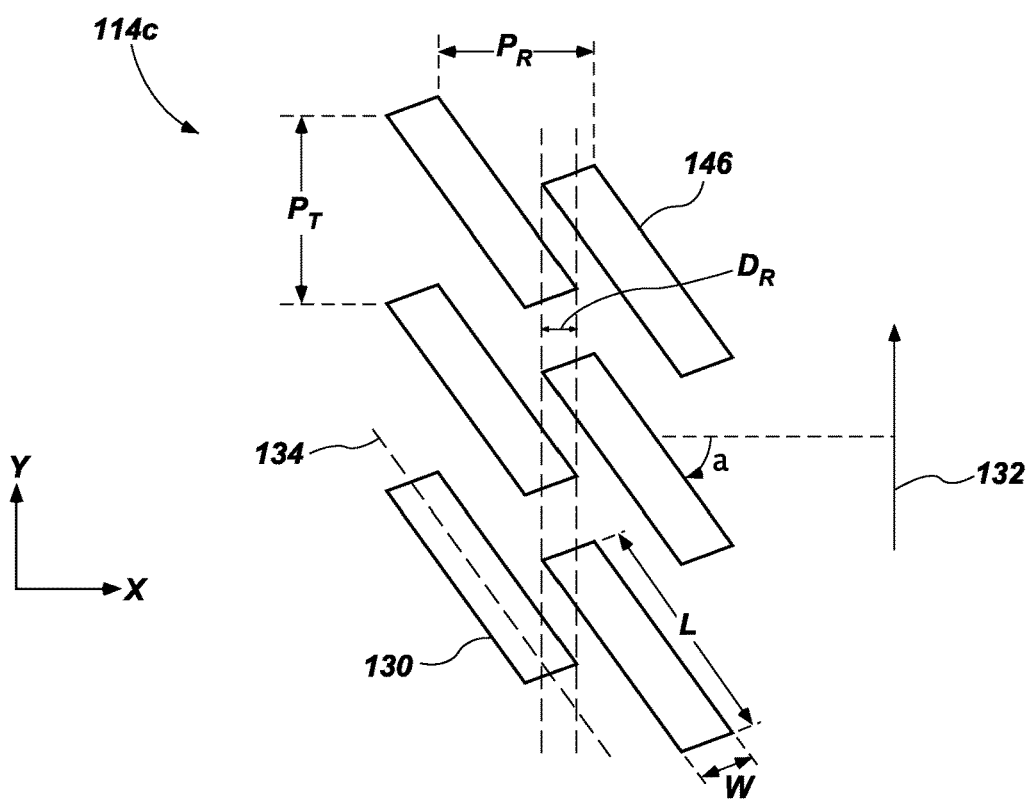
FIG. 2B is a simplified enlarged view of box B illustrated in FIG. 2A.

FIG. 2B is a simplified expanded view of the box B of FIG. 2A. FIG. 2B illustrates some of the asperities 130 of segment 114c. In FIG. 2B, the tangent of the pad 114 proximate the asperities 130 illustrated is represented by arrow 132. Accordingly, in FIG. 2B, the intended direction of motion of the pad 114 in use and operation is in the upward in the view illustrated in FIG. 2B.

The asperities 130 may be oriented at a skew angle α relative to a plane that is orthogonal to the tangent 132 of the pad 114 (or the tangent of the pad 114 at that particular location). Stated another way, an asperity 130 may be oriented at a skew angle α defined as an angle between the longitudinal axis 134 of the asperity 130 and the radial direction of the pad 114 at the location of the asperity 130. The skew angle α may also be referred to herein as a so-called "orientation angle." The asperities 130 of each segment 114a-114h may be oriented at the skew angle α between the longitudinal axis 134 of the asperities 130 and a line orthogonal to the tangent 132 (e.g., the radial direction) of the particular segment 114a-114h in which the asperities 130 are located. In some embodiments, where the individual segments 114a-114h extend over a range of angles θ (FIG. 2A), the tangent 132 of the particular segment may be represented as the tangent 132 at the angular center of the particular segment 114l-114h. For example, the tangent 132 of the pad 114 at segment 114c (FIG. 2A) may be determined at an intersection of the x-axis and the circumference of the pad 114 at the segment 114c and the skew angle α may correspond to the angle between the longitudinal axis 134 of the asperity 130 and the x-axis.

It will be understood that the skew angle α of asperities 130 within the same segment 114a-114h differ from the skew angle α of other asperities 130 within the same segment 114a-114h since the asperities 130 may be substantially parallel, even though they may be located at a different angular location θ on the pad 114. In other words, the skew angle α of the asperities 130 within a given section 114a-114h may vary by as much as the fraction of the angular area occupied by the segment 114a-114h. For example, where the pad 114 comprises eight segments 114a-114h, each segment 114a-114h occupying about the same portion of the pad 114, the difference in skew angle α between some of the asperities 130 may be as much as about 45° (i.e., 360/8=45°). In other embodiments, the asperities 130 within the same segment 114a-114h may be oriented at substantially the same skew angle α. In some such embodiments, the asperities 130 within the same segment 114a-114h may not be substantially parallel. In some embodiments, asperities 130 within a first segment 114a-114h may have about the same skew angle α as asperities 130 located at a corresponding location within a second segment 114a-114h. For example, asperities 130 located proximate an angular center of a first segment 114a-114h may exhibit about the same skew angle α as asperities located proximate an angular center of a second segment 114a-114h. Although FIG. 2B illustrates that each of the asperities 130 has substantially the same skew angle α, the disclosure is not so limited. In some embodiments, the skew angle α may vary from asperity 130 to asperity 130. As only one example, the skew angle α may increase with an increasing distance of the asperities 130 from a center of the pad 114.

As a number of segments 114a-114h of the pad 114 increases, a variation in the skew angle α between asperities 130 within the same segment 114a-114h may be reduced.

Since the skew angle α of an asperity 130 is defined as the angle between the longitudinal axis 134 of the asperity 130 and a radial line (a line that is orthogonal to the tangent 132 of the pad 114) at the same angular orientation θ as the asperity 130, the asperities 130 may be oriented to have substantially the same skew angle α, even though they are not oriented at the same angle θ (FIG. 2A) with respect to the x-axis. In other words, even though the asperities 130 are not substantially parallel (or the longitudinal axes 134 of the asperities 130 are not substantially parallel), the asperities 130 may exhibit a uniform (substantially uniform) skew angle α. In some embodiments, even though the asperities 130 of a first segment 114a-114h are not substantially parallel with asperities 130 of a second segment 114a-114h, the asperities 130 of the first segment 114a-114h may exhibit about the same skew angle α as the asperities 130 of the second segment 114a-114.

The substantially uniform skew angle α may facilitate substantially uniform material removal from the surfaces of the wafer 102 (FIG. 1) and may facilitate a substantially uniform planarization of the wafer 102. In addition, the skew angle α may be tailored to adjust a distribution of forces applied between the polishing pad 114 and the wafer 102. For example, as the skew angle α is increased, a radial force (a force in the radial direction) of the pad 114 may be reduced and a transverse force (a force in a direction that is orthogonal to the radial force) may be increased.

The skew angle α may be within a range from about 0° (greater than about 0°) and about 80° (e.g., less than or equal to about 80°), such as from about 0° and about 5°, from about 5° and about 10°, from about 10° and about 15°, from about 15° and about 30°, from about 30° and about 45°, from about 45° and about 60°, or from about 60° to about 80°. In some embodiments, the skew angle α is within a range from about 25° and about 45°, such as from about 20° and about 25°, from about 25° and about 30°, from about 30° and about 35°, from about 35° and about 40°, or from about 40° and about 45°. In some embodiments, the skew angle α may be greater than about 45°. Without being bound by any particular theory, it is believed that an increasing skew angle α increases a shearing (cutting) action of the asperities 130 and facilitates improved planarization of the wafer 102 due to a reduced area (swath) covered per asperity 130 during rotation of the pad 114 relative to the wafer 102. In addition, an increasing skew angle α may facilitate an effectively longer asperity 130 in the direction of motion that bridges peaks in topography of the wafer 102. Bridging the peaks in topography of the wafer 102 may facilitate preferential material removal from upper surfaces of the wafer 102 relative to lower surfaces (e.g., trenches) of the wafer 102 and reduce an extent of so-called "dishing." In other words, as the skew angle α increases, each individual asperity 130 may contact a smaller surface area (swath) of the wafer 102 during rotation of the wafer 102. Stated in yet another way, increasing the skew angle α may reduce an amount by which the asperity 130 extends in the radial dimension, reducing the swath of the wafer 102 contacted by the asperity 130 during use of the pad 114.

With continued reference to FIG. 2B, the asperities 130 may be oriented and patterned on the polishing pad 114 to have a radial pitch $P_R$ and a transverse pitch $P_T$. The radial pitch $P_R$ may be defined as a distance between similar features in the radial direction. The transverse pitch $P_T$ at a particular location may be defined as a distance between similar features in a direction that is transverse to the radial direction at that particular location. The transverse direction at a particular location may be a direction that is perpendicular to the radial direction at the particular location.

The radial pitch $P_R$ may be within a range from about 5 μm to about 1,000 μm, such as from about 5.0 μm to about 10.0 μm, from about 10.0 μm to about 50 μm, from about 50 μm to about 100 μm, from about 100 μm to about 500 μm, or from about 500 μm to about 1,000 μm. However, the disclosure is not so limited, and the radial pitch $P_R$ may be different than those described above.

The transverse pitch $P_T$ may be within a range from about 5 μm to about 1,000 μm, such as from about 5.0 μm to about 10.0 μm, from about 10.0 μm to about 50 μm, from about 50 μm to about 100 μm, from about 100 μm to about 250 μm, or from about 250 μm to about 500 μm, or from about 500 μm to about 1,000 μm. However, the disclosure is not so limited, and the transverse pitch $P_T$ may be different than those described above. In some embodiments, the transverse pitch $P_T$ is equal to about the radial pitch $P_R$. In other embodiments, the transverse pitch $P_T$ is greater than the radial pitch $P_R$. In yet other embodiments, the transverse pitch $P_T$ is less than the radial pitch $P_R$.

A ratio between the transverse pitch $P_T$ and the radial pitch $P_R$ may be within a range from about 0.1:1.0 to about 10.0:1.0, such as from about 0.1:1:0 to about 0.25:1.0, from about 0.25:1.0 to about 0.50:1.0, from about 0.75:1.0 to about 1.0:1.0, from about 2.5:1.0 to about 5.0:1.0, from about 5.0:10 to about 7.5:1.0, or from about 7.5:1.0 to about 10.0:1.0. In other words, the radial pitch $P_R$ may be as much as ten times greater than the transverse pitch $P_T$ and the transverse pitch $P_T$ may be as much as ten times greater than the radial pitch $P_R$.

The length L of the asperities 130, which may be in a direction that is parallel with the direction of the longitudinal axis 134 (FIG. 2B) of the respective asperity 130, may be within a range from about 50 μm to about 1,000 mm, such as from about 50 μm to about 75 μm, from about 75 μm to about 100 μm, from about 100 μm to about 200 μm, from about 200 μm to about 400 μm, from about 400 μm to about 600 μm, from about 600 μm to about 800 μm, or from about 800 μm to about 1,000 μm. In some embodiments, the length is within a range from about 100 μm to about 500 μm, such as from about 100 μm to about 200 μm, from about 200 μm to about 300 μm, from about 300 μm to about 400 μm, or from about 400 μm to about 500 μm. Without being bound by any particular theory, it is believed that tailoring the length L may facilitate bridging wafer topography having a certain length scale (e.g., pitch between adjacent features). A greater length may increase the length scale and may reduce a stiffness of the asperity 130.

A width W of an upper surface 140 (FIG. 2C) of the asperities 130 may be within a range from about 10 μm to about 200 μm, such as from about 10 μm to about 25 μm, from about 25 μm to about 50 μm, from about 50 μm to about 75 μm, from about 75 μm to about 100 μm, from about 100 μm to about 150 μm, or from about 150 μm to about 200 μm. In some embodiments, the width W is within a range from about 20 μm to about 100 μm. An increasing width W may increase a stiffness of the asperity 130 and may also increase a length scale of planarization of the polishing pad 114. The width W may be in a direction that is substantially perpendicular to the length L and the longitudinal axis 134 of the asperity 130.

An aspect ratio of the asperities 130, defined as a ratio between the length L and the width W, may be within a range from about 2:1 to about 20:1, such as from about 2:1 to about 3:1, from about 3:1 to about 4:1, from about 4:1 to about 5:1, from about 5:1 to about 10:1, from about 10:1 to about 15:1, or from about 15:1 to about 20:1. In other words, the length L of the asperities 130 may be at least about 2 times, at least about 3 times, at least about 4 times, at least about 5 times, at least about 10 times, at least about 15 times, or even at least about 20 times greater than the width W of the asperities 130. In some embodiments, the aspect ratio of the asperities 130 is within a range from about 2:1 to about 5:1 or from about 3:1 to about 5:1. In other embodiments, the aspect ratio is greater than about 5:1.

In some embodiments, a degree of overlap of the asperities 130, which may be represented as radial distance $D_R$, may be within a range from about 0.5 μm to about 500 μm, such as from about 0.5 μm and about 1.0 μm, from about 1.0 μm to about 5 μm, from about 5 μm to about 10 μm, from about 10 μm to about 50 μm, from about 50 μm to about 100 μm, from about 100 μm to about 200 μm, from about 220 μm to about 300 μm, from about 300 μm to about 400 μm, or from about 400 μm to about 500 μm. In some embodiments, the asperities 130 may overlap one another by a radial distance $D_R$ that is within a range from about 0% to about 50% the length L of the asperities 130, such as from about 0% to about 10%, from about 10% to about 20%, from about 20% to about 30%, from about 30% to about 40%, or from about 40% to about 50% the length L of the asperities 130.

Increasing the degree of overlap of the asperities 130 may facilitate improved planarization of features on the wafer 102 having a relatively greater pitch without increasing a length L of the asperities 130 due to overlap of the paths of adjacent asperities 130, providing a redundant shearing action across the surface of the wafer 102. In some embodiments, the degree of overlap of the asperities 130, the transverse pitch $P_T$, and the radial pitch $P_R$ may affect a localized pressure and a number of contact areas between the pad 114 and the wafer 102, which may affect removal rates, planarization, and the hydrodynamics of the fluid medium 126 (FIG. 1) in use and operation.

Figure 2C:
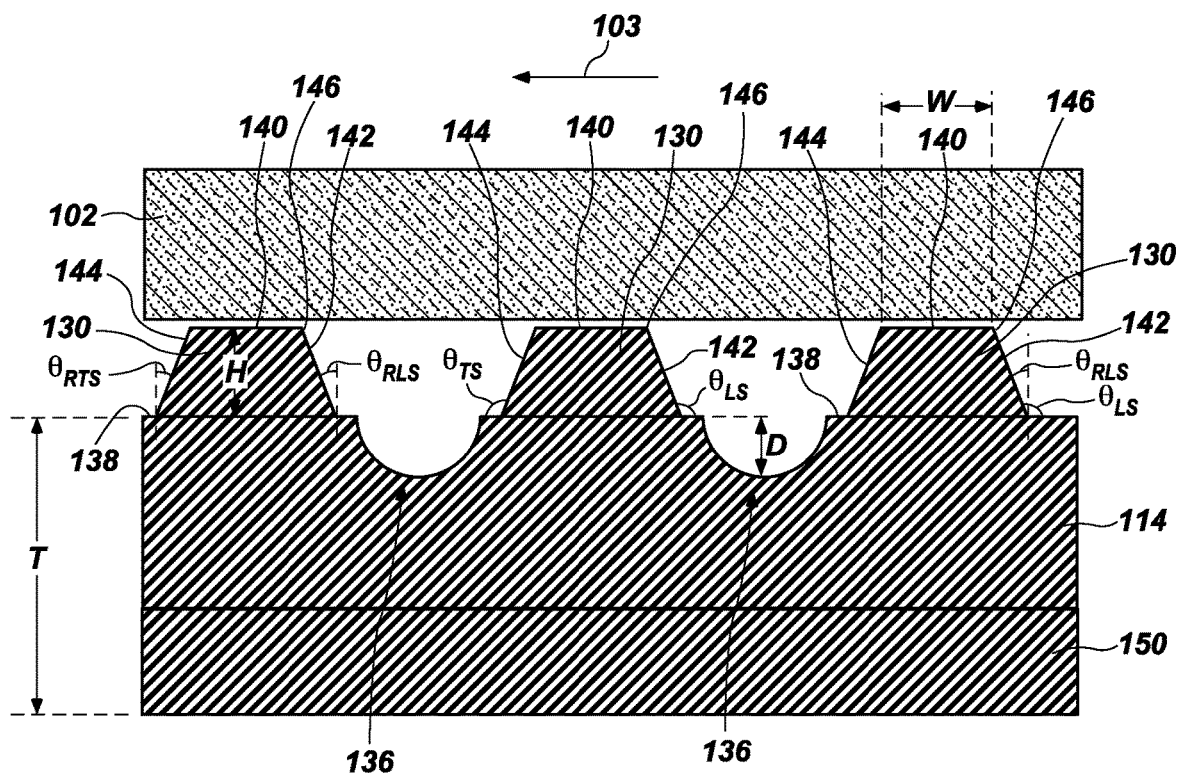
FIG. 2C is a simplified cross-sectional view of the pad taken along section line C-C in FIG. 2A, in accordance with embodiments of the disclosure.

FIG. 2C is a simplified cross-sectional view of the pad 114 adjacent to the wafer 102, taken along section line C-C of FIG. 2A. In FIG. 2C, the wafer 102 is moving from right to left relative to the pad 114, as indicated at arrow 103. The pad 114 may include the asperities 130 and may further include one or more pores 136 located between adjacent asperities 130.

In some embodiments, a subpad 150 may be located adjacent (e.g., below) the pad 114. The subpad 150 may be bonded to the pad 114 with, for example, an adhesive. The subpad 150 may be located between the pad 114 and the platen 116 (FIG. 1). The subpad 150 may improve uniformity of planarity across the surface of the wafer 102. In some embodiments, the subpad 150 may comprise a material of substantially greater rigidity than material of pad 114, which may be of much lesser thickness. In some such embodiments, the pad 114 may be less prone to deformation in use and operation. In other embodiments, the subpad 150 comprises a soft material exhibiting conforming properties. In some such embodiments, the pad 114 may be configured to conform to surfaces of the wafer 102 (FIG. 1) in use and operation.

A combined thickness T of the pad 114 and the subpad 150 may be within a range from about 0.5 mm to about 5.0 mm, such as from about 0.5 mm to about 1.0 mm, from about 1.0 mm to about 2.0 mm, from about 2.0 mm to about 3.0 mm, from about 3.0 mm to about 4.0 mm, or from about 4.0 mm to about 5.0 mm. In some embodiments, the thickness T is within a range from about 2.5 mm to about 3.0 mm. The thickness T and the hardness of the pad 114 and subpad 150 may affect a degree of conformability of the pad 114 to the wafer 102 (FIG. 1). By way of nonlimiting example, as the thickness T is increased, a relatively soft pad 114 may be configured to more substantially conform to surface features of the wafer 102.

With continued reference to FIG. 2C, the asperities 130 may extend from a major surface 138 of the pad 114, which may also be referred to as a land region of the pad 114, by a height H. The major surface 138 may be located between the asperities 130 and the pores 136. In some embodiments, the major surface 138 is substantially planar and the major surface 138 between a first set of asperities 130 is coplanar with the major surface 138 between another set of asperities 130.

The pores 136 may exhibit any shape such as, for example, at least one of cylindrical, spherical (truncated spherical), cubic, rectangular prism, triangular prism, hexagonal prism, triangular pyramid, 4, 5, or 6-sided pyramid, truncated pyramid, cone, truncated cone, or another shape. In some embodiments, the pores 136 exhibit the same shape. In other embodiments, at least some of the pores 136 have different shapes than at least others of the pores 136.

The pores 136 may have a depth D that is less than about 1 mm, less than about 500 µm, less than about 250 µm, less than about 100 µm, or even less than about 50 µm. The pores 136 may have a dimension (e.g., diameter) at a location substantially coplanar with the major surface 138 within a range from about 10 µm to about 10 mm, such as from about 10 µm to about 20 µm, from about 20 µm to about 40 µm, from about 40 µm to about 60 µm, from about 60 µm to about 80 µm, from about 80 µm to about 100 µm, from about 100 µm to about 250 µm, from about 250 µm to about 500 µm, or from about 500 µm to about 1 mm. In some embodiments, the dimension (the mean pore dimension) may be about 20 µm.

The height H of the asperities 130 may be within a range from about 5 µm to about 200 µm, such as from about 5 µm to about 10 µm, from about 10 µm to about 25 µm, from about 25 µm to about 50 µm, from about 50 µm to about 100 µm, from about 100 µm to about 150 µm, of from about 150 µm to about 200 µm. In some embodiments, the height H is within a range from about 10 µm to about 40 µm. A shorter height H may increase a stiffness of the asperity 130. In some embodiments, the height H of an asperity 130 may not be substantially uniform. In other words, a distance between the upper surface 140 of the asperity 130 and the major surface 138 of the pad 114 may vary within the particular asperity 130.

With continued reference to FIG. 2C, the asperities 130 may have a leading surface 142 and a trailing surface 144. The leading surface 142 may terminate at a shearing edge or a shearing (cutting) edge 146 at a distal extent of the leading surface 142. At least a portion of the leading surface 142 may be oriented and configured to engage and shear (cut) material from a portion of the wafer 102 at the shearing edge 146 as the asperity 130 passes proximate the wafer 102.

The leading surface 142 may be oriented at a leading surface included angle $\theta_{LS}$ with respect to the major surface 138. The leading surface included angle $\theta_{LS}$ may be within a range from about 45° to about 150°, such as from about 45° to about 60°, from about 60° and about 75°, from about 75° and about 90°, from about 90° to about 105°, from about 105° to about 120°, from about 120° to about 135°, or from about 135° to about 150°. In some embodiments, the leading surface included angle $\theta_{LS}$ may be within a range from about 90° (e.g., greater than about 90°) and about 135°, such as from about 90° to about 120°. In some embodiments, the leading surface included angle $\theta_{LS}$ is greater than about 90°.

In some embodiments, the leading surface 142 may form a so-called leading surface rake angle $\theta_{RLS}$ with the major surface 138. The leading surface rake angle $\theta_{RLS}$ may be defined as an angle between a line normal to a major surface 138 of the wafer 102 and the leading surface 142. The leading surface rake angle $\theta_{RLS}$ may be within a range from about 0° to about 45°, such as from about 0° to about 15°, from about 15° to about 30°, or from about 30° to about 45°. In some embodiments, the leading surface rake angle $\theta_{RLS}$ may be within a range from about 0° to about 30°. The leading surface rake angle $\theta_{RLS}$ may also be referred to herein as a leading surface draft angle or leading surface back rake angle.

The trailing surface 144 may be oriented at a trailing surface included angle $\theta_{TS}$ with respect to the major surface 138. The trailing surface included angle $\theta_{TS}$ may be within a range from about 45° to about 150°, such as from about 45° to about 60°, from about 60° to about 75°, from about 75° to about 90°, from about 90° to about 105°, from about 105° to about 120°, from about 120° to about 120° and about 135°, or from about 135° to about 150°. In some embodiments, the trailing surface included angle $\theta_{TS}$ may be greater than the leading surface included angle $\theta_{LS}$. Without being bound by any particular theory, it is believed that a trailing surface included angle $\theta_{TS}$ greater than a leading surface included angle $\theta_{LS}$ may facilitate increased support of the asperity 130 by producing a so-called buttressing effect, support the asperity 130 from shear and normal forces, and facilitate increased rigidity of the asperity 130 along the direction of motion.

In some embodiments, the trailing surface 144 may form a so-called trailing surface rake angle $\theta_{RTS}$ with the major surface 138. The trailing surface rake angle $\theta_{RTS}$ may be defined as an angle between a line normal to a major surface 138 of the wafer 102 and the trailing surface 144. The trailing surface rake angle $\theta_{RTS}$ may be within a range from about 0° to about 60°, such as from about 0° to about 15°, from about 15° to about 30°, from about 30° to about 45°, or from about 45° to about 60°. In some embodiments, the trailing surface rake angle $\theta_{RTS}$ may be within a range from about 15° to about 45°. The trailing surface rake angle $\theta_{RTS}$ may also be referred to herein as the trailing surface draft angle.

In some embodiments, one or more of the asperities 130 may exhibit a leading surface rake angle $\theta_{RLS}$ that is different from a trailing surface rake angle $\theta_{RTS}$ of the respective one or more of the asperities 130. In some such embodiments, the asperities 130 may not be substantially symmetrical. In other embodiments, one or more asperities 130 may exhibit a leading surface rake angle $\theta_{RLS}$ that is the same as a trailing surface rake angle $\theta_{RTS}$ of the respective one or more asperities 130.

Although FIG. 2C illustrates that the asperities 130 have a negative leading surface rake angle $\theta_{RLS}$ (the leading surface included angle $\theta_{LS}$ is greater than about 90°), the disclosure is not so limited. In other embodiments, the leading surface rake angle $\theta_{RLS}$ may be a positive rake angle, wherein the leading surface included angle $\theta_{LS}$ is less than about 90°.

Without being bound by any particular theory, it is believed that the leading surface included angle $\theta_{LS}$ may be tailored to modify interactions between the pad 114 and the wafer 102. For example, decreasing the leading surface included angle $\theta_{LS}$ (forming the leading surface included angle $\theta_{LS}$ to be more acute) may decrease an applied force to remove material from the wafer 102. In other words, a lower force may be required to be applied between the pad 114 and the wafer 102 to remove a given amount of material from the wafer 102. In some embodiments increasing the leading surface included angle $\theta_{LS}$ (forming the leading surface included angle $\theta_{LS}$ to be less acute) may increase a durability of the leading surface 142 of the asperity 130. Similarly, increasing the trailing surface included angle $\theta_{TS}$ may increase a rigidity of the asperity 130. It is believed that higher trailing surface included angles $\theta_{TS}$ provide improved support for the asperity 130 in the form of a buttress, since the base of the asperity 130 may have a greater dimension than the upper surface 140. Increasing the leading surface included angle $\theta_{LS}$ may increase an applied force between the leading surface 142 and the wafer 102, increasing friction between the leading surface 142 and the wafer 102, and facilitate a reduced surface roughness of the wafer 102 surface during a CMP process.

With reference to FIG. 2B and FIG. 2C, the skew angle α may be tailored to adjust the shearing action on the wafer 102 imposed by the asperities 130. As the skew angle α is increased, the shearing edge 146 of the asperity 130 may act on a smaller portion (surface area, swath) of the wafer 102. In addition, as the skew angle α is increased, the asperities 130 may act with increased stiffness (since not as much of a surface area of the asperities 130 is orthogonal to the direction of motion of the wafer 102 in use and operation, which may also be referred to as a so-called buttressing effect). In addition, increasing the skew angle α may increase an effective leading surface included angle $\theta_{LS}$ presented to the wafer 102 surface by the shearing edge 146. For cases where the leading surface included angle $\theta_{LS}$ is greater than about 90°, the effective leading surface included angle $\theta_{LS}$ will appear to increase due to the relative motion of the pad 114 and the wafer 102 and the reduced swath of the wafer 102 contacted by the shearing edge 146, which may improve surface finish of the wafer 102 (i.e., reduce a surface roughness of the wafer 102 surface). Higher skew angles α may also direct more of the forces between the asperity 130 and the wafer 102 in a radial direction, which may facilitate a shearing (cutting) action. As the skew angle α is decreased, the effective surface area (swath) of the wafer 102 acted upon by the shearing edge 146 of the asperity 130 may be larger, which may change an applied unit force of the shearing action imposed by the shearing edge 146 of the asperities 130. In embodiments where the leading surface included angle $\theta_{LS}$ is less than 90°, the effective angle presented by the shearing edge 146 is deceased, making it functionally more acute and reducing the shearing action of the shearing edge 146 is reduced. In addition, as the skew angle α is decreased, the asperities 130 may exhibit a reduced stiffness in use and operation, since the force exerted upon the asperities 130 is more normal the longitudinal axes 134 of the asperities 130.

Although FIG. 2C illustrates the asperities 130 as comprising a separate material relative to the pad 114, the disclosure is not so limited. In some embodiments, the asperities 130 are integral with the pad 114 and comprise the same material composition as the pad 114.

Figure 2D:
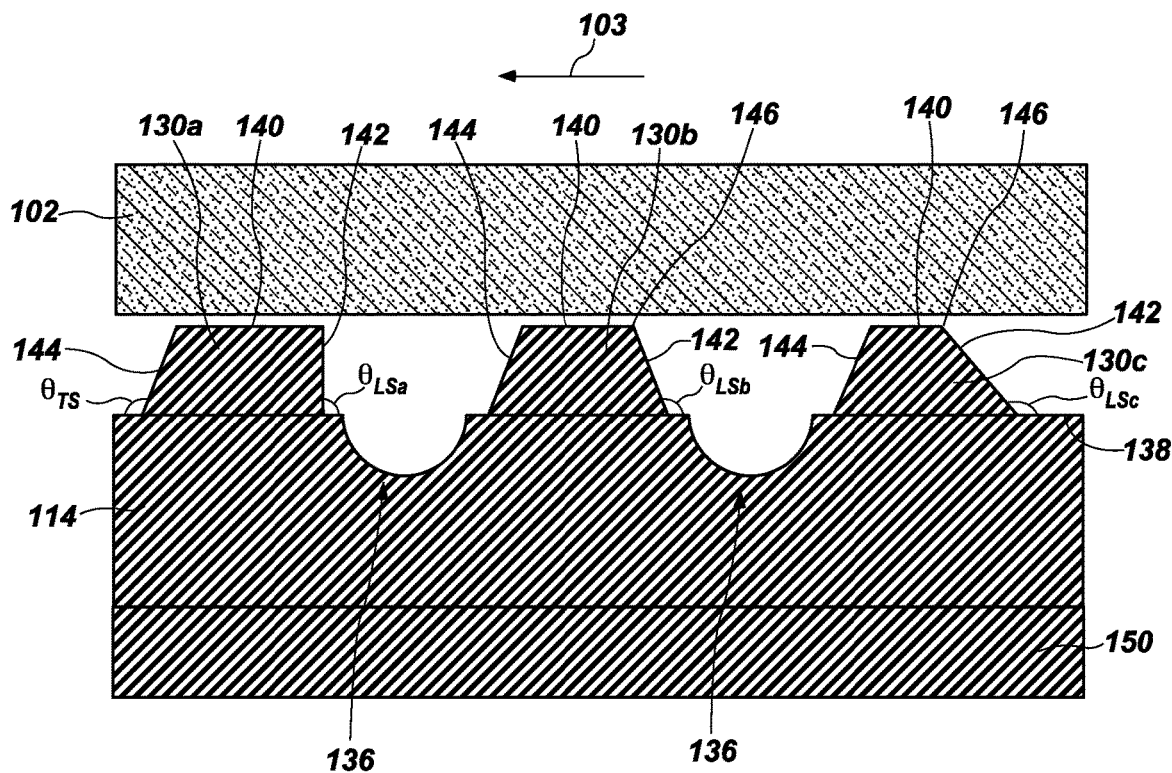
FIG. 2D is a simplified cross-sectional view of a pad, in accordance with other embodiments of the disclosure.

Although FIG. 2C has been described and illustrated as including asperities 130, each exhibiting a same leading surface included angle $\theta_{LS}$ as the leading surface included angle $\theta_{LS}$ as the other asperities 130, the disclosure is not so limited. In other embodiments, at least some of the asperities 130 may have a different leading surface included angle $\theta_{LS}$ than other asperities 130 of the pad 114. As only one example, asperities 130 within a segment 114a-114h may have a different leading surface included angle $\theta_{LS}$ than other asperities 130 within the same segment 114a-114h. In other embodiments, at least one of the segments 114a-114h may include asperities 130 having about the same leading surface included angle $\theta_{LS}$ as other asperities 130 within the at least one of the segments 114a-114h and different than the leading surface included angle $\theta_{LS}$ as asperities 130 of at least another of the segments 114a-114h. For example, with reference to FIG. 2D, the pad 114 may include a first asperity 130a having a first leading surface included angle $\theta_{LS_a}$, a second asperity 130b having a second leading surface included angle $\theta_{LS_b}$ different than the first leading surface included angle $\theta_{LS_a}$, and a third asperity 130c having a third leading surface included angle $\theta_{LS_c}$ different than the first leading surface included angle $\theta_{LS_a}$ and the second leading surface included angle $\theta_{LS_b}$. In some embodiments, the trailing surface included angle $\theta_{TS}$ of each asperity 130a, 130b, 130c may be substantially the same, even though the leading surface included angles $\theta_{LS}$ may vary. In some such embodiments, the asperities 130a, 130b, 130c may be asymmetric.

Similarly, although FIG. 2C has been described and illustrated as including asperities 130, each exhibiting a same trailing surface included angle $\theta_{TS}$ as the trailing surface included angle $\theta_{TS}$ as the other asperities 130, the disclosure is not so limited. In other embodiments, at least some of the asperities 130 may have a different trailing surface included angle $\theta_{TS}$ than other asperities 130 of the pad 114. For example, in some embodiments, the first asperity 130a may have a different trailing surface included angle $\theta_{TS}$ than the second asperity 130b and the third asperity 130c, and the second asperity 130b may have a different trailing surface included angle $\theta_{TS}$ than the third asperity 130c.

Figure 2E:
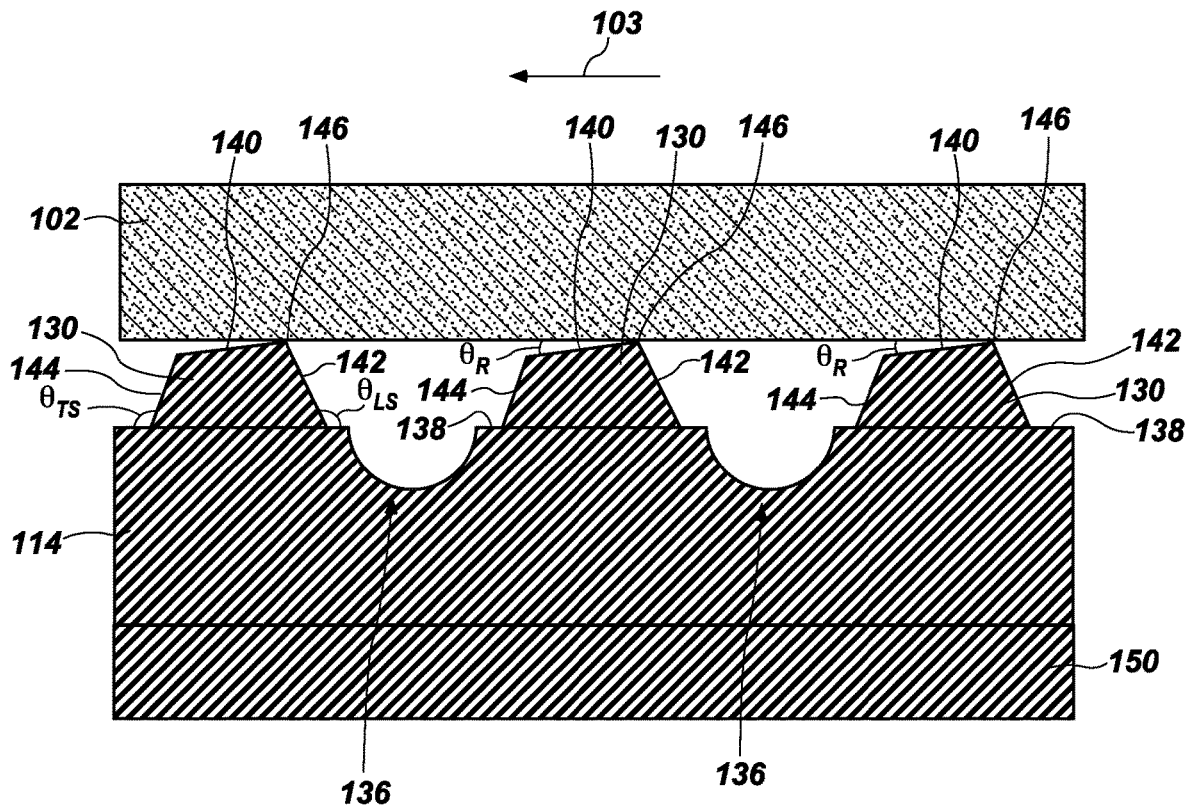
FIG. 2E is a simplified cross-sectional view of a pad including asperities having a relief angle, in accordance with some embodiments of the disclosure.

In some embodiments, the upper surface 140 of the asperities 130 may not be substantially parallel to the major surface 138. With reference to FIG. 2E, at least one asperity 130 may include an upper surface 140 that is oriented at a relief angle $\theta_R$ with respect to major surface 138. In some embodiments, all of the asperities 130 include an upper surface 140 that is oriented at the relief angle $\theta_R$ with respect to the major surface 138.

The relief angle $\theta_R$ may be tailored to modify an extent of interaction between the shearing edges 146 and upper surfaces 140 of the asperities 130, the wafer 102, and particles that may be present in the fluid medium 126 (FIG. 1). A relief angle $\theta_R$ larger than about 0° may facilitate removal of fluid medium 126, debris, or other materials from an interface between the asperities 130 and the wafer 102 during use and operation. In addition, the relief angle $\theta_R$ may facilitate a shearing action by increasing applied unit force between the shearing edge 146 and the wafer 102. In other words, an increasing relief angle $\theta_R$ may increase force of interaction between the shearing edge 146 of the asperity 130 and the wafer 102.

As the relief angle $\theta_R$ is reduced (e.g., down to about 0°, wherein the upper surface 140 is coplanar with the major surface 138 and the wafer 102), interactions between the upper surface 140 and the wafer 102 are increased and applied unit force is decreased, as surface area between such an asperity 130 is increased. In addition, interactions in the form of rubbing between particles in the fluid medium 126 (FIG. 1), the wafer 102, and the upper surface 140 may be increased relative to embodiments including a relief angle $\theta_R$ greater than about 0°. Thus, the relief angle $\theta_R$ may affect removal rates and planarization of the wafer 102 during use and operation.

The relief angle $\theta_R$ may be within a range from about 0° (greater than about 0°) to about 20° (e.g., less than about 20°), such as from about 0° to about 2°, from about 2° to about 5°, from about 5° to about 10°, from about 10° to about 15°, or from about 15° to about 20°. In some embodiments, the relief angle is within a range from about 0° (greater than about 0°) to about 10° (e.g., less than about 10°). Although the asperities 130 of FIG. 2E have been described and illustrated to include a relief angle $\theta_R$ such that the shearing edge 146 is located higher (farther from the major surface 138) than other portions of the upper surface 140, the disclosure is not so limited. In other embodiments, the asperities 130 may include a shearing edge 146 that is lower than other portions of the upper surface 140.

Figure 2F:
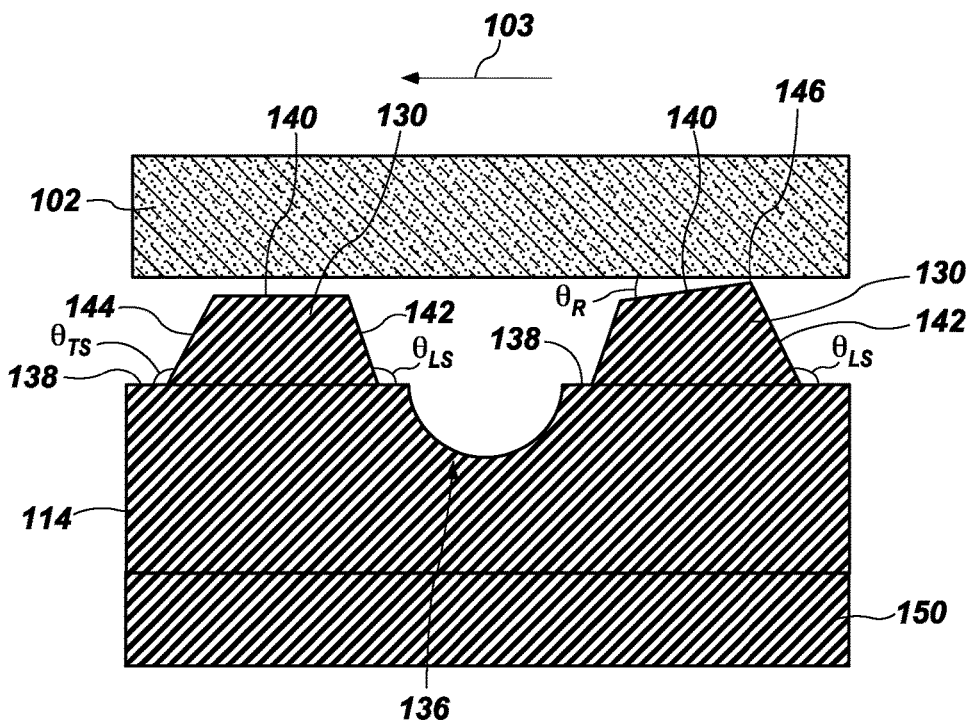
FIG. 2F is a simplified cross-sectional view of a pad, in accordance with embodiments of the disclosure.

Referring to FIG. 2F, in some embodiments, at least some of the asperities 130 may include an upper surface 140 oriented at a relief angle $\theta_R$ and at least other asperities 130 may not include a relief angle $\theta_R$ and may have an upper surface 140 that is substantially parallel with the major surface 138. In such embodiments, and as shown in FIG. 2F, a rotationally trailing asperity 130 may exhibit a lesser height above major surface 138 than a rotationally leading asperity 130. In some embodiments, a rotationally leading asperity 130 may include a relief angle $\theta_R$ and a rotationally trailing asperity 130 may not include a relief angle $\theta_R$. In some such embodiments, the rotationally leading asperity 130 may shear a portion of the wafer 102 to be planarized while the rotationally trailing asperity 130 polishes the surface of the wafer 102 by a polishing action or interaction with particles of the fluid medium 126 particles, the wafer 102, and the upper surface 140 of the rotationally trailing asperity 130. In such embodiments, rotationally trailing asperity 130 may serve as a standoff to limit the degree of penetration of shearing edge 146 into the material of wafer 102, thus enhancing planarity of the wafer 102 surface.

Figure 2G:
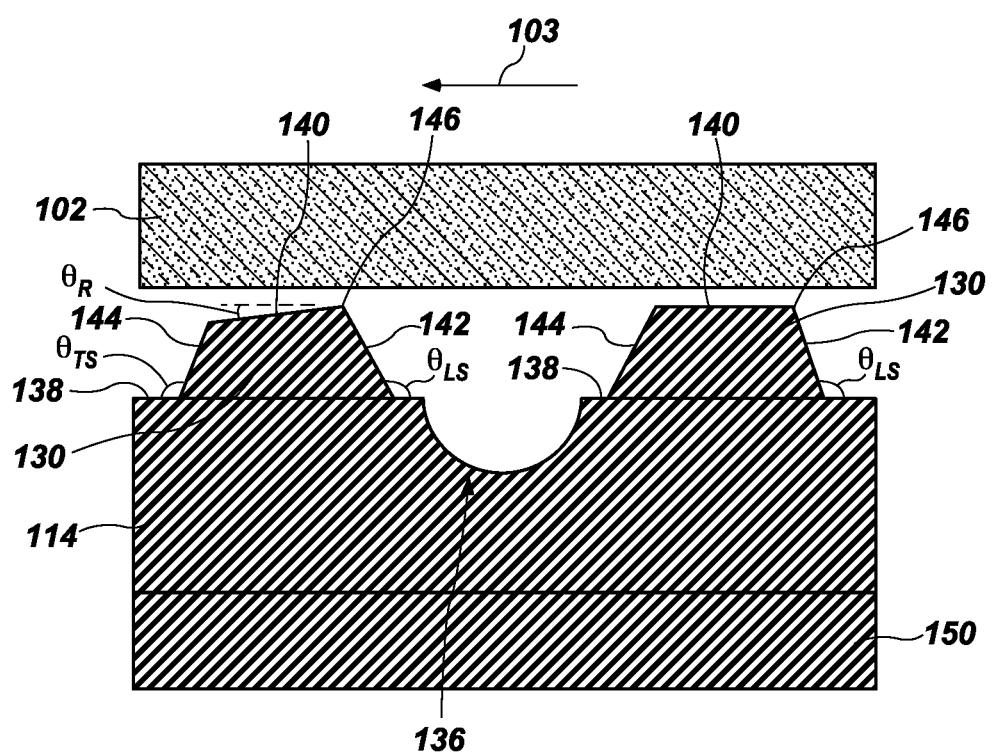
FIG. 2G is a simplified cross-sectional view of a pad, in accordance with embodiments of the disclosure.

With reference to FIG. 2G, in other embodiments, rotationally leading asperity 130 may have an upper surface 140 that is substantially parallel with the major surface 138, while rotationally trailing asperity 130 may be positioned at a relief angle $\theta_R$. In such an instance, the rotationally leading asperity 130 may clear particulate matter of the fluid medium as well as wafer debris, enabling shearing edge 146 of rotationally trailing asperity to more effectively engage material on the surface of wafer 102. Of course, if rotationally leading asperity 130 is of lesser height than rotationally trailing asperity 130, rotationally leading asperity may function to limit the depth of engagement of shearing edge 146 of rotationally trailing asperity 130. In all such instances as illustrated and discussed with respect to FIG. 2F and FIG. 2G, the presence of asperities with upper surfaces 140 parallel to major surface 138 will serve to limit the unit force applied by pad 114 to wafer 102.

In some embodiments, every other asperity 130 at the same radial distance on the pad 114 (distance from the center of the pad 114) may include a relief angle $\theta_R$ while the other asperities 130 do not include a relief angle $\theta_R$.

Figure 2H:
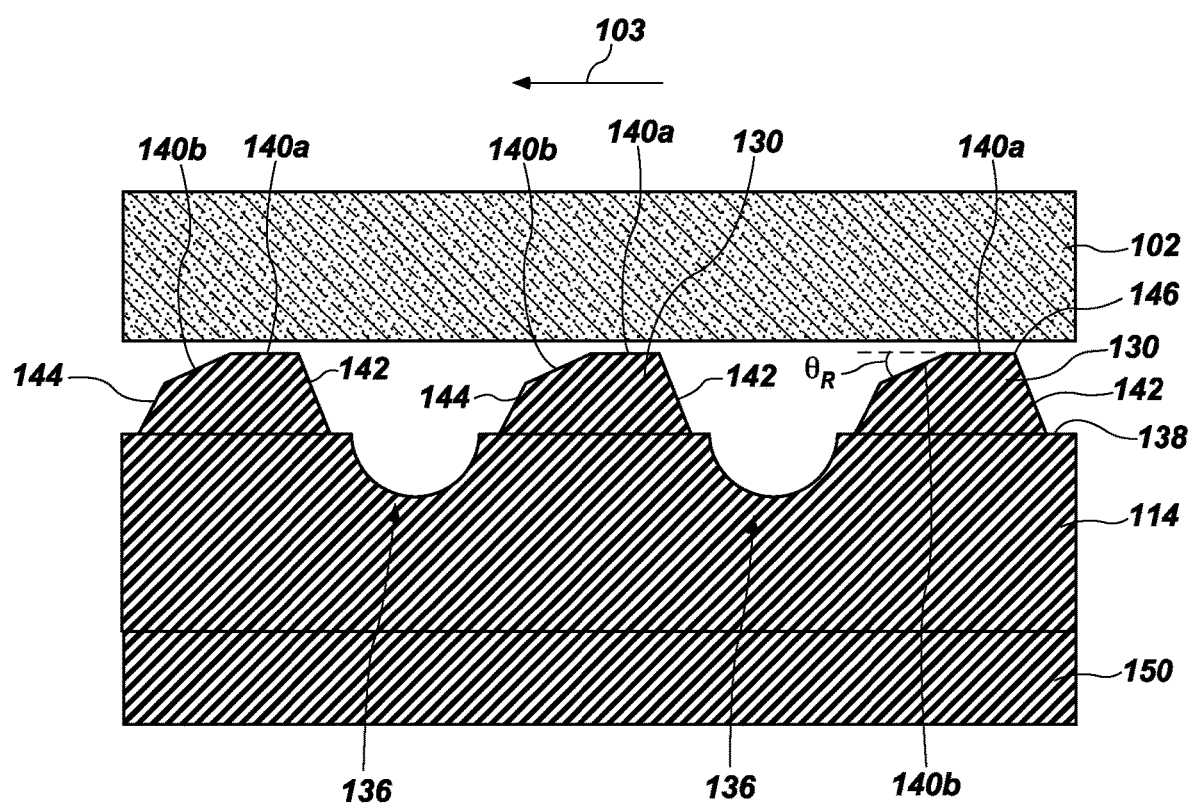
FIG. 2H is a simplified cross-sectional view of a pad, in accordance with embodiments of the disclosure.

With reference to FIG. 2H, in some embodiments, the pad 114 includes asperities 130 having an upper surface 140 including a first portion 140a (e.g., a first segment, a first region) that is substantially planar with the major surface 138 and a second portion 140b (e.g., a second segment, a second region) that is oriented at the relief angle $\theta_R$ with respect to the major surface 138. In some such embodiments, the first portion 140a of the asperity 130 may exhibit improved durability in use and operation relative to asperities 130 that do not include the first portion 140a and the second portion 140b. In some embodiments, the asperities 130 include second portions 140b having the same relief angle $\theta_R$. In other embodiments, at least some of the asperities 130 may have a different relief angle $\theta_R$ than at least others of the asperities 130.

Although FIG. 2A through FIG. 2H have illustrated and described the asperities 130 as having a linear shape and a trapezoidal cross-section, the disclosure is not so limited. In other embodiments, a shape of the asperities 130 may be at least one of cylindrical, spherical (truncated spherical), cubic, rectangular prism, triangular prism, hexagonal prism, triangular pyramid, 4, 5, or 6-sided pyramid, truncated pyramid, cone, truncated cone, arc shape, or another shape.

In some embodiments, one or more features of the pad 114 may change as a function of radius (with a distance from the center of the pad 114). For example, one or more of the height H, width W, length L, skew angle $\alpha$, leading surface included angle $\theta_{LS}$, trailing surface included angle $\theta_{TS}$, relief angle $\theta_R$, asperity 130 density, ratio between asperity length L and asperity width W, or other parameter may change as a function of radius (distance from a center of the pad 114). By way of nonlimiting example, in some embodiments, an asperity length L may change (increase, decrease) with an increasing distance from the center of the pad 114. In other embodiments, the skew angle $\alpha$ may change (decrease, increase) with an increasing distance from the center of the pad 114. As another example, the leading surface included angle $\theta_{LS}$ may change (increase, decrease) with an increasing distance from the center of the polishing pad 114. In some embodiments, the leading surface included angle $\theta_{LS}$ and the trailing surface included angle $\theta_{TS}$ may change (increase, decrease) with an increasing distance from the center of the pad 114. In some embodiments, the relief angle $\theta_R$ may change (increase, decrease) with an increasing distance from the center of the pad 114. In yet other embodiments, the ratio between the length and the width may change (increase, decrease) with an increasing distance from the center of the pad 114. In some embodiments, the skew angle α may change (increase, decrease) with an increasing distance from the center of the pad 114.

A removal rate achieved by the pads 114 described herein may be within a range from about 100 Å/min to about 10,000 Å/min, such as from about 100 Å/min to about 500 Å/min, from about 500 Å/min to about 1,000 Å/min, from about 1,000 Å/min to about 2,000 Å/min, from about 2,000 Å/min to about 3,000 Å/min, from about 3,000 Å/min to about 4,000 Å/min, from about 4,000 Å/min to about 5,000 Å/min, or from about 5,000 Å/min to about 10,000 Å/min. Although particular removal rates have been described, the disclosure is not so limited and the removal rate achieved by the pads 114 may be different than those described.

In some embodiments, the pad 114 may be formed by a method that may facilitate fabrication of a pad 114 having uniformly sized, shaped, and patterned features (e.g., asperities 130 and pores 136). By way of nonlimiting example, the pad 114 may be formed by microreplication. In some such embodiments, the pad 114 may be formed to include precisely shaped topographical features (e.g., asperities 130 and pores 136) by casting or molding a polymer (or a polymer precursor that is later cured to form a polymer) in a production tool, such as a mold. The mold may include a plurality of topographical features that correspond to the asperities 130. In other embodiments, the pad 114 may be formed by, for example, 3D printing techniques (e.g., stereolithography, photolithography, other 3D printing methods), embossing (e.g., micro-embossing), or other methods, to form the precisely shaped and oriented asperities 130. In some such embodiments, the pad 114 may be formed to include asperities 130 that are formed to a net shape. Further, in some such embodiments, asperities 130 may be formed of a different material than the body of pad 114 and exhibit at least one of different hardness, stiffness, or density. In addition, different formulations of the same material, for example polyurethane, may be employed to form asperities 130 in comparison to the remainder of pad 114.

Since the pad 114 is formed by microreplication or other methods, the pad 114 may be formed to include precisely patterned asperities 130 having, for example, a desired skew angle α. In addition, the asperities 130 may be precisely patterned to have controllable sizes and shapes (e.g., height H, length L, width W, leading surface rake angle $\theta_{RLS}$, trailing surface rake angle $\theta_{RTS}$, relief angle $\theta_R$). By way of comparison, pads 114 formed by conventional techniques such as foaming polyurethane may include asperities that are generated via porosity and diamond disk conditioning, which may form asperities that do not exhibit substantially uniform sizes, shapes, and orientations.

Without being bound by any particular theory, it is believed that the pads 114 including the asperities 130 having the leading surface 142, the trailing surface 144, the shearing edge 146, the relief angle $\theta_R$, the leading surface included angle $\theta_{LS}$, the trailing surface included angle $\theta_{TS}$, the height H, the width W, and the length L, and other features as described herein, may facilitate improved planarization, controllability, and repeatability of the CMP process. In some embodiments, a length scale of planarization (e.g., ability of the pad 114 to planarize features having a desired pitch) may be tailored by the asperities 130. For example, the length L of the asperities 130 may facilitate bridging of high points of wafer topography, facilitating removal of material from the high points while reducing material removal from the low points of wafer topography. In addition to the length L of the asperities 130, adjusting the ratio of the length L to the width W may affect the planarization length scale. In addition, the radial pitch $P_R$ and the transverse pitch $P_T$ may be tailored to adjust the radial overlap and the transverse overlap of adjacent asperities 130, which in turn, may affect a length scale of planarization (e.g., increasing one or both of the radial pitch $P_R$ and the transverse pitch $P_T$ may increase the planarization length scale of the pad 114). In some embodiments, the skew angle α may be altered to alter the length of the asperity 130 in the transverse direction and in the radial direction.

In some embodiments, a gel-like hydrolyzed layer of fluid medium and materials removed from the wafer 102 may be more effectively removed from the interface between the wafer 102 and the pad 114 due to the sizes, shapes, and orientations of the asperities 130 along the surface of the pad 114. The asperities 130 may be designed and oriented along the surface of the pad 114 to facilitate shearing and a scraping (cutting) action to the surface of the wafer 102, as opposed to only a polishing action, as in conventional CMP pads. In other words, the shearing edges 146 of leading surfaces 142 of the asperities 130 may be oriented, sized, and shaped to remove material from the surface of the wafer 102 by shearing action. Even though the fluid medium 126 may form a hydrolyzed gel-like layer including siloxane linkages (—Si—O—Si—) between surfaces of the wafer 102 and the fluid medium 126 particles, the asperities 130 may be sized, shaped, and oriented to remove the hydrolyzed layer.

The pads 114 described herein may facilitate improved uniformity of planarization relative to conventional polishing pads. The pads 114 may exhibit a reduced within wafer non-uniformity and a reduced wafer to wafer non-uniformity relative to conventional polishing pads. The pad 114 described herein may be used in stop-in-film CMP processes, stop-on-film applications, and buffing applications wherein surface topography and surface roughness is removed from a wafer. The pads 114 may be used in CMP processes including planarization of metals such as at least one of tungsten, titanium, nickel, platinum, ruthenium, rhodium, aluminum, copper, molybdenum, gold, iridium, metal oxides such as titanium oxide, hafnium oxide, zirconium oxide, aluminum oxide, tungsten oxide, ruthenium oxide, iridium oxide, metal nitrides such as tungsten nitride, titanium nitride, tantalum nitride, titanium aluminum nitride, dielectric materials such as silicon dioxide, phosphosilicate glass, borosilicate glass, fluorosilicate glass, metal silicides, metal carbides, a conductively-doped semiconductor material (e.g., conductively-doped silicon, conductively-doped germanium, conductively-doped silicon germanium), polysilicon, a polymeric film such as a photoresist material, or another material.

Although the pads 114 of FIG. 2A through FIG. 2H have been described as comprising segments 114a-114h having a particular size, shape, and orientation, and having grooves 145 having a particular pattern, the disclosure is no so limited. In some embodiments, the grooves 145 may exhibit at least one of a circular shape (e.g., the pad 114 may include concentric grooves), a spiral shape, or may extend in the radial direction. For example, with reference to FIG. 3, a pad 314 may include segments 314a-314h, each including an outer first portion 315a, an inner third portion 315c, and a middle second portion 315b between the first portion 315a and the second portion 315b. The pad 314 may include asperities 130, as described above with reference to FIG. 2A through FIG. 2H, but are not illustrated in FIG. 3 for clarity.

In some embodiments, the pad 314 may include grooves 345 for facilitating removal of materials removed from the wafer 102 from the interface between the pad 314 and the wafer 102. In addition, the grooves 345 may facilitate flow of fluid medium 126 (FIG. 1) to various locations on the pad 314 surface. In some embodiments, the grooves 345 may be located between adjacent segments 314a-314h. In addition, the grooves 345 may be located between the portions of each segment 314a-314c, such as between the first portion 315a and the second portion 315b and between the second portion 315b and the third portion 315c. The grooves 345 may form a pattern of concentric circles (corresponding to the first portions 315a, the second portions 315b, and the third portions 315c).

Figure 3:
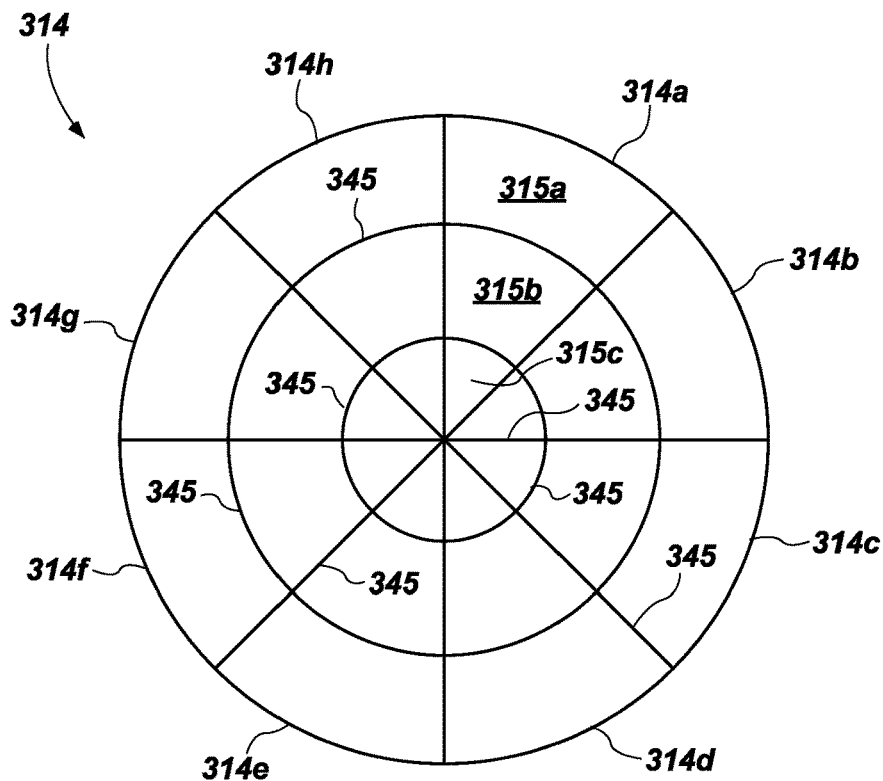
FIG. 3 is a simplified top view of a pad having grooves, in accordance with embodiments of the disclosure.
Figure 4:
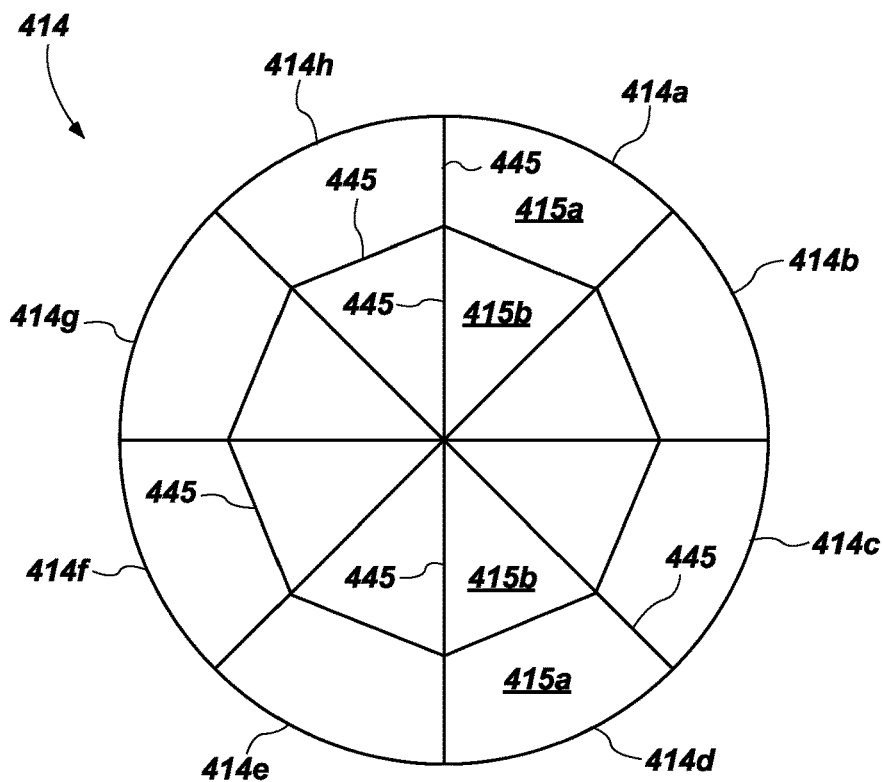
FIG. 4 is a simplified top view of a pad having grooves, in accordance with other embodiments of the disclosure.

Referring to FIG. 4, a pad 414 may include segments 414a-414h having a different design that that illustrated in FIG. 3. For example, the pad 414 may include segments 414a-414h, each having an outer first portion 415a and an inner second portion 415b. The pad 414 may include grooves 445, which may be located at boundaries between the segments 414a-414h and between portions of each segment 414a-414h. For example, grooves 445 may be located between the first portion 415a and the second portion 415b. The grooves 445 between the first portion 415a and the second portion 415b may be substantially linear.

Figure 5:
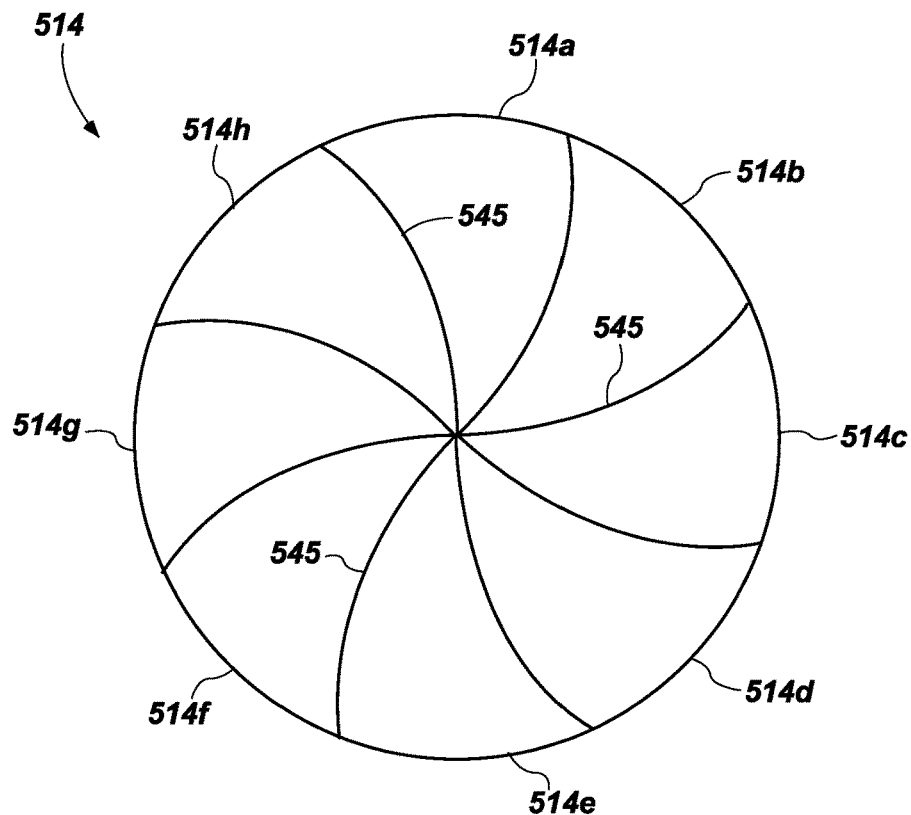
FIG. 5 is a simplified top view of another pad having grooves, in accordance with embodiments of the disclosure.

FIG. 5 illustrates a pad 514 including segments 514a-514h and having grooves 545 between the segments 514a-514h. The segments 514a-514h may comprise arcuate (spiraling) sides. The pad 514 may include grooves 545 located at the boundary between adjacent segments 514a-514h. Thus, the grooves 545 may exhibit a spiral shape having an arcuate pattern from a circumference of the pad 514 to the center of the pad 514.

Figure 6:
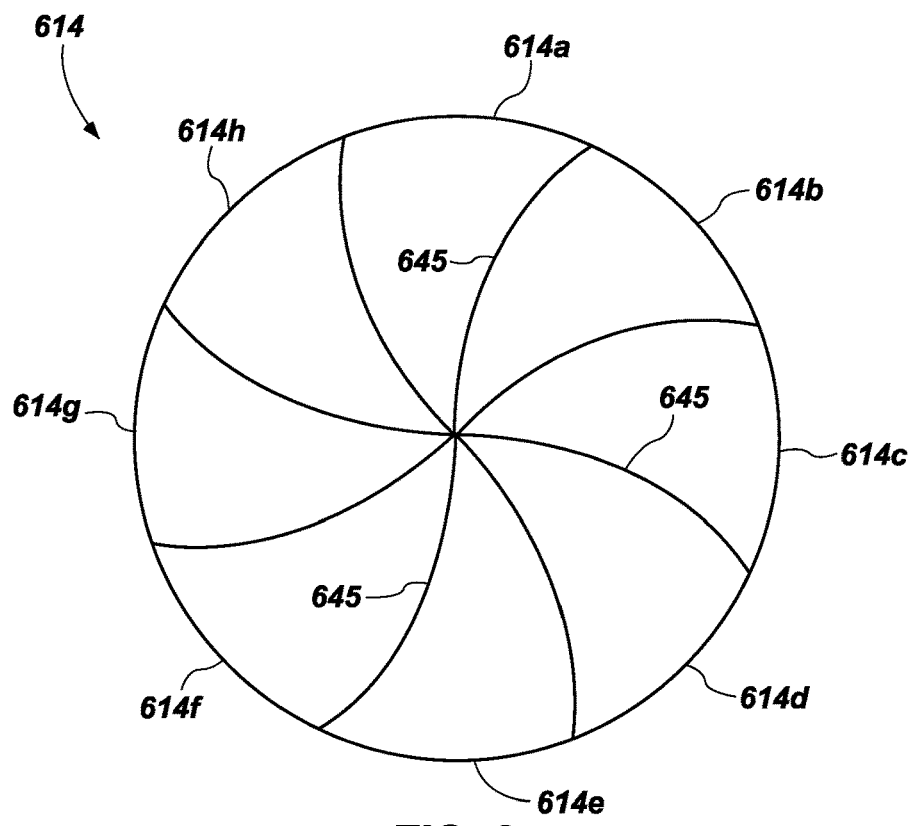
FIG. 6 is a simplified top view of a pad having grooves, in accordance with yet other embodiments of the disclosure.

FIG. 6 illustrates a pad 614 including segments 614a-614h and having grooves 545 between the segments 614a-614h. The segments 614a-614h may comprise arcuate (spiraling) sides. The pad 614 may include grooves 645 located at the boundary between adjacent segments 614a-614h. Thus, the grooves 645 may exhibit a spiral shape having an arcuate pattern from a circumference of the pad 614 to the center of the pad 614.

Thus, in accordance with embodiments of the disclosure, a pad for chemical mechanical planarization comprises a material having a major surface, and asperities extending from the major surface, a ratio between a length and a width of each of the asperities greater than about 2:1, and an included angle between a leading surface of at least some asperities and the major surface greater than about 90°.

Furthermore, in accordance with additional embodiments of the disclosure, a pad comprises a substantially circular base having a major surface, and asperities extending a height above the major surface. At least some of the asperities individually comprise sides defining a leading surface and a trailing surface, and an upper surface between the leading surface and the trailing surface, wherein an angle between the major surface and the upper surface is within a range from greater than about 0° to about 20°.

Moreover, in accordance with embodiments of the disclosure, a tool for chemical mechanical planarization comprises a wafer carrier configured to hold a wafer, a platen, and a pad coupled to the platen. The pad comprises a material having a major surface, and asperities extending above the major surface by a height, at least some of the asperities each having a width and a length, wherein a longitudinal axis of the at least some of the asperities is oriented at an angle with respect to a longitudinal axis of at least some other of the asperities.

In addition, in accordance with embodiments of the disclosure, a pad for chemical mechanical planarization comprises a material having a major surface, and asperities on the major surface, the asperities comprising a leading surface, a trailing surface, an upper surface between the leading surface and the trailing surface, a shearing edge at an intersection of the leading surface and the upper surface.

Furthermore, in accordance with additional embodiments of the disclosure, a pad comprises at least one rotationally leading asperity over a major surface of a base material and a rotationally trailing asperity rotationally trailing the at least one rotationally leading asperity. The at least one rotationally leading asperity comprises a leading surface, a trailing surface, and an upper surface between the leading surface and the trailing surface, the upper surface being angled with respect to the major surface.

In addition, in accordance with embodiments of the disclosure, a method of planarizing a semiconductor device comprises placing a wafer in a wafer carrier, and contacting the wafer with a pad while moving the wafer relative to the pad. The pad comprises segments defining at least a portion of the pad, at least some of the segments exhibiting asperities each individually having a width and a length, an angle between a longitudinal axis of each of the asperities of a first segment and a line orthogonal to a tangent of the pad at the first segment different than another angle between an additional longitudinal axis of each of the asperities of a second segment and a line orthogonal to another tangent of the pad at the second segment. The method further comprises shearing material from a surface of the wafer in contact with at least some of the asperities having a shearing edge at a distal end of the asperities of the at least some of the asperities.

Additional nonlimiting example embodiments of the disclosure are described below.

Embodiment 1

A pad for chemical mechanical planarization, the polishing pad comprising: a material having a major surface; and asperities extending from the major surface, a ratio between a length and a width of each of the asperities greater than about 2:1, and an included angle between a leading surface of at least some asperities and the major surface greater than about 90°.

Embodiment 2

The pad of Embodiment 1, wherein the included angle between the leading surface of the at least some asperities is within a range from about 90° to about 120°.

Embodiment 3

The pad of Embodiment 1 or Embodiment 2, wherein another included angle between a trailing surface of the at least some asperities and the major surface is greater than about 90°.

Embodiment 4

The pad of Embodiment 3, wherein the included angle between the leading surface of the at least some asperities and the major surface is different than the another included angle between the trailing surface of the at least some asperities and the major surface.

Embodiment 5

The pad of any one of Embodiments 1 through 4, wherein the at least some asperities are asymmetrical.

Embodiment 6

The pad of any one of Embodiments 1 through 5, wherein the at least some asperities comprise an upper surface oriented at a relief angle relative to the major surface.

Embodiment 7

The pad of Embodiment 6, wherein the relief angle is greater than 0° and less than or equal to about 20°.

Embodiment 8

The pad of any one of Embodiments 1 through 7, wherein at least some other of the asperities comprise an upper surface substantially parallel with the major surface of the base material.

Embodiment 9

The pad of any one of Embodiments 1 through 8, wherein the ratio between the length and the width of each of the asperities is greater than about 5:1.

Embodiment 10

The pad of any one of Embodiments 1 through 9, wherein the pad is substantially circular and a distance between asperities in a radial direction is within a range from about 0.5 µm to about 1,000 µm.

Embodiment 11

The pad of any one of Embodiments 1 through 10, wherein the pad is substantially circular and the asperities are oriented to have a skew angle between a longitudinal axis of the asperities and a line perpendicular to a tangent of the polishing pad proximate the asperities, the skew angle within a range from about 25° and about 45°.

Embodiment 12

The pad of any one of Embodiments 1 through 11, wherein the skew angle of the at least some asperities varies with a distance from a center of the pad.

Embodiment 13

The pad of any one of Embodiments 1 through 12, wherein the pad is substantially circular and substantially all of the asperities are oriented at about a same angle relative to a line perpendicular to a tangent of the pad proximate a location of respective asperities.

Embodiment 14

A pad, comprising: a substantially circular base having a major surface; and asperities extending a height above the major surface, at least some of the asperities individually comprising: sides defining a leading surface and a trailing surface; and an upper surface between the leading surface and the trailing surface, wherein an angle between the major surface and the upper surface is within a range from greater than about 0° to about 20°.

Embodiment 15

The pad of Embodiment 14, wherein the angle is greater than 0° and less than or equal to about 10°.

Embodiment 16

The pad of Embodiment 14 or Embodiment 15, wherein the at least some of the asperities each exhibit a substantially linear shape.

Embodiment 17

The pad of any one of Embodiments 14 through 16, wherein the at least some of the asperities have a length being greater than a width of the respective asperities of the at least some of the asperities.

Embodiment 18

The pad of any one of Embodiments 14 through 17, wherein the at least some of the asperities are oriented on the pad such that a longitudinal axis of the at least some of the asperities is not substantially parallel with a longitudinal axis of at least some other of the asperities.

Embodiment 19

The pad of any one of Embodiments 14 through 18, wherein a skew angle between a longitudinal axis of the at least some of the asperities and a line orthogonal to a tangent of the pad proximate each respective asperity is substantially the same.

Embodiment 20

The pad of Embodiment 19, wherein the skew angle is greater than 0° and less than or equal to about 60°.

Embodiment 21

The pad of any one of Embodiments 14 through 20, wherein an angle between the leading surface and the major surface of the base is different than an angle between the trailing surface and the major surface of the base.

Embodiment 22

The pad of any one of Embodiments 14 through 21, wherein the at least some of the asperities are asymmetrical.

Embodiment 23

The pad of any one of Embodiments 14 through 22, wherein the at least some of the asperities are asymmetrically arranged on the polishing pad.

Embodiment 24

The pad of any one of Embodiments 14 through 23, wherein the angle between the major surface of the base and the upper surface varies with a distance of the respective asperity from a center of the pad.

Embodiment 25

A tool for chemical mechanical planarization, the tool comprising: a wafer carrier configured to hold a wafer; a platen; and a pad coupled to the platen, the pad comprising: a material having a major surface; and asperities extending above the major surface by a height, at least some of the asperities each having a width and a length, wherein a longitudinal axis of the at least some of the asperities is oriented at an angle with respect to a longitudinal axis of at least some other of the asperities.

Embodiment 26

The tool of Embodiment 25, wherein a ratio between the length and the width of the at least some of the asperities is greater than about 5:1.

Embodiment 27

The tool of Embodiment 25 or Embodiment 26, wherein an angle between a leading surface of the at least some of the asperities and the major surface of the material is greater than about 90°.

Embodiment 28

The tool of Embodiment 27, wherein an additional angle between a trailing surface of the at least some of the asperities and the major surface of the material is greater than about 90° and is different than the angle between the leading surface of the at least some of the asperities and the major surface of the material.

Embodiment 29

The tool of any one of Embodiments 25 through 28, wherein an upper surface of the at least some of the asperities is angled with respect to the major surface.

Embodiment 30

The tool of any one of Embodiments 25 through 29, wherein the at least some of the asperities comprise an upper surface having a first portion being substantially parallel with the major surface and a second portion being angled with respect to the major surface.

Embodiment 31

The tool of Embodiment 30, wherein a distance between the first portion of the upper surface and the major surface of the material is greater than another distance between the second portion of the upper surface and the major surface of the material.

Embodiment 32

The tool of Embodiment 30 or Embodiment 31, wherein the first portion of the upper surface is located proximate a leading surface of the at least some of the asperities and the second portion of the upper surface is located proximate a trailing surface of the at least some of the asperities.

Embodiment 33

The tool of any one of Embodiments 25 through 32, wherein the pad comprises pores extending below the major surface of the material.

Embodiment 34

The tool of any one of Embodiments 25 through 33, wherein the at least some of the asperities comprise an upper surface forming an angle with respect to the major surface and the at least others of the asperities comprise an upper surface that is substantially parallel with the major surface.

Embodiment 35

A method of planarizing a semiconductor device, the method comprising: contacting a wafer with a pad while moving the wafer relative to the pad, the pad comprising: segments defining at least a portion of the pad, at least some of the segments exhibiting asperities each individually having a width and a length, an angle between a longitudinal axis of each of the asperities of a first segment and a line orthogonal to a tangent of the pad at the first segment different than another angle between an additional longitudinal axis of each of the asperities of a second segment and a line orthogonal to another tangent of the pad at the second segment; and shearing material from a surface of the wafer in contact with at least some of the asperities having a shearing edge at a distal end of the asperities of the at least some of the asperities.

Embodiment 36

The method of Embodiment 35, wherein moving the wafer with relative to the pad comprises independently rotating each of the wafer and the pad.

Embodiment 37

The method of Embodiment 35 or Embodiment 36, wherein contacting the wafer with a pad comprises contacting the wafer with a pad comprising at least eight segments.

Embodiment 38

The method of any one of Embodiments 35 through 37, further comprising introducing a fluid medium between the wafer and the pad while contacting the wafer with the pad.

Embodiment 39

The method of Embodiment 38, wherein introducing a fluid medium between the wafer and the pad comprises introducing deionized water between the wafer and the pad.

Embodiment 40

A pad for chemical mechanical planarization, the pad comprising: a material having a major surface; and asperities on the major surface, the asperities comprising a leading surface, a trailing surface, an upper surface between the leading surface and the trailing surface, a shearing edge at an intersection of the leading surface and the upper surface.

Embodiment 41

The pad of Embodiment 40, wherein an angle between the major surface and the leading surface is different than an angle between the major surface and the trailing surface.

Embodiment 42

The pad of Embodiment 40 or Embodiment 41, wherein the upper surface is not parallel with the major surface.

Embodiment 43

The pad of any one of Embodiments 40 through 42, wherein the upper surface is oriented at an angle within a range from greater than about 0° to about 10° with respect to the major surface.

Embodiment 44

The pad of any one of Embodiments 40 through 43, further comprising at least some pores located between adjacent asperities.

Embodiment 45

The pad of any one of Embodiments 40 through 44, wherein the pad comprises at least eight segments, the asperities of each segment parallel with other asperities of their respective segment and angled with respect to asperities of at least other segments.

Embodiment 46

A pad, comprising: at least one rotationally leading asperity over a major surface of a base material, wherein the at least one rotationally leading asperity comprises: a leading surface; a trailing surface; and an upper surface between the leading surface and the trailing surface; and a rotationally trailing asperity rotationally trailing the at least one rotationally leading asperity, at least one of the upper surface of the rotationally leading asperity and an upper surface of the rotationally trailing asperity being angled with respect to the major surface.

Embodiment 47

The pad of Embodiment 46, further comprising a shearing edge at an intersection of the leading surface and the upper surface.

Embodiment 48

The pad of Embodiment 45 or Embodiment 46, wherein the rotationally trailing asperity has a height less than a height of the rotationally leading asperity.

Embodiment 49

The pad of any one of Embodiments 45 through 48, wherein the upper surface of the rotationally trailing asperity is parallel with the major surface.

Embodiment 50

The pad of any one of Embodiments 45 through 48, wherein the upper surface of the rotationally leading asperity is parallel with the major surface and the upper surface of the rotationally trailing asperity is oriented at an angle with respect to the major surface.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A pad for chemical mechanical planarization, the pad comprising:
a material having a circular shape and comprising a major surface; and
asperities extending from the major surface, a ratio between a length and a width of each of the asperities greater than about 2:1, and an included angle between a leading surface of at least some asperities and the major surface greater than about 90°, a skew angle between a longitudinal axis of each of the at least some of the asperities and a line perpendicular to a tangent of the pad proximate each of the respective at least some of the asperities within a range from about 25° and about 45°, an overlap of the asperities in a radial direction within a range from about 0.5 μm and about 500 μm.

2. The pad of claim 1, wherein the included angle between the leading surface of the at least some asperities is within a range from about 90° to about 120°.

3. The pad of claim 1, wherein the at least some asperities are asymmetrical.

4. The pad of claim 1, wherein the ratio between the length and the width of each of the asperities is greater than about 5:1.

5. The pad of claim 1, wherein the skew angle of the at least some asperities varies with a distance from a center of the pad.

6. The pad of claim 1, wherein the skew angle of each of the at least some of the asperities is the same.

7. The pad of claim 1, wherein a ratio of a pitch of the asperities in a direction transverse to a radial direction to a pitch of the asperities in the radial direction is within a range from about 1.0:1.0 to about 2.5:1.0.

8. The pad of claim 1, wherein the at least some of the asperities comprise a planar upper surface oriented at a relief angle greater than 0° with respect to the major surface.

9. The pad of claim 1, wherein at least one asperity comprises an upper surface oriented at a relief angle with respect to the major surface, the at least one asperity neighboring at least one other asperity comprising an upper surface parallel to the major surface.

10. The pad of claim 1, wherein another included angle between a trailing surface of the at least some asperities and the major surface is greater than about 90°.

11. The pad of claim 10, wherein the included angle between the leading surface of the at least some asperities and the major surface is different than the another included angle between the trailing surface of the at least some asperities and the major surface.

12. The pad of claim 1, wherein the at least some asperities comprise an upper surface oriented at a relief angle relative to the major surface.

13. The pad of claim 12, wherein the relief angle is greater than 0° and less than or equal to about 20°.

14. The pad of claim 12, wherein at least some other of the asperities comprise an upper surface parallel with the major surface of the material.

15. The pad of claim 1, wherein the at least some of the asperities comprise an upper surface having a first portion being parallel with the major surface and a second portion being angled with respect to the major surface.

16. The pad of claim 15, wherein a distance between the first portion of the upper surface and the major surface of the material is greater than another distance between the second portion of the upper surface and the major surface of the material.

17. The pad of claim 15, wherein the first portion of the upper surface is located proximate a leading surface of the at least some of the asperities and the second portion of the upper surface is located proximate a trailing surface of the at least some of the asperities.

18. A tool for chemical mechanical planarization, the tool comprising:
- a wafer carrier configured to hold a wafer;
- a platen; and
- a pad coupled to the platen, the pad having a circular shape and comprising:
  - a material having a major surface; and
  - asperities extending above the major surface by a height, a ratio between a length and a width of each of the asperities greater than about 2:1, an included angle between a leading surface of at least some of the asperities and the major surface greater than about 90°, a skew angle between a longitudinal axis of the at least some of the asperities and a line perpendicular to a tangent of the pad proximate each of the respective at least some of the asperities within a range from about 25° and about 45°, an overlap of the asperities in a radial direction within a range from about 0.5 µm and about 500 µm.

19. The tool of claim 18, wherein the ratio between the length and the width of the at least some of the asperities is greater than about 5:1.

20. The tool of claim 18, wherein an additional angle between a trailing surface of the at least some of the asperities and the major surface of the material is greater than about 90° and is different than the angle between the leading surface of the at least some of the asperities and the major surface of the material.

21. The tool of claim 18, wherein an upper surface of the at least some of the asperities is angled with respect to the major surface.

22. The tool of claim 18, wherein the pad comprises pores extending below the major surface of the material.

23. The tool of claim 18, wherein the at least some of the asperities comprise an upper surface forming an angle with respect to the major surface and at least others of the asperities comprise an upper surface that is substantially parallel with the major surface.

24. The tool of claim 18, wherein the at least some of the asperities comprise an upper surface having a first portion being substantially parallel with the major surface and a second portion being angled with respect to the major surface.

25. The tool of claim 24, wherein a distance between the first portion of the upper surface and the major surface of the material is greater than another distance between the second portion of the upper surface and the major surface of the material.

26. The tool of claim 24, wherein the first portion of the upper surface is located proximate a leading surface of the at least some of the asperities and the second portion of the upper surface is located proximate a trailing surface of the at least some of the asperities.

27. A method of planarizing a semiconductor device, the method comprising:
- contacting a wafer with a pad while moving the wafer relative to the pad, the pad comprising:
  - a material having a circular shape and comprising a major surface and
  - segments defining at least a portion of the pad, at least some of the segments comprising:
  - asperities extending from the major surface, each of the asperities individually exhibiting a ratio between a width and a length of each of the asperities greater than about 2:1 and an included angle between a leading surface of at least some asperities and the major surface of the pad greater than about 90°, a skew angle between a longitudinal axis of each asperity and a line perpendicular to a tangent of the pad proximate each of the respective asperities within a range from about 25° and about 45°, an overlap of the asperities in a radial direction within a range from about 0.5 µm and about 500 µm; and
- shearing material from a surface of the wafer in contact with at least some of the asperities having a shearing edge at a distal end of the asperities of the at least some of the asperities.

28. The method of claim 27, wherein moving the wafer relative to the pad comprises independently rotating each of the wafer and the pad.

29. The method of claim 27, wherein contacting the wafer with a pad comprises contacting the wafer with a pad comprising at least eight segments.

30. The method of claim 27, further comprising introducing a fluid medium between the wafer and the pad while contacting the wafer with the pad.

31. The method of claim 30, wherein introducing a fluid medium between the wafer and the pad comprises introducing deionized water between the wafer and the pad.

* * * * *

UNITED STATES PATENT AND TRADEMARK OFFICE
CERTIFICATE OF CORRECTION

PATENT NO. : 11,331,767 B2
APPLICATION NO. : 16/265311
DATED : May 17, 2022
INVENTOR(S) : James Bresson Page 1 of 1

It is certified that error appears in the above-identified patent and that said Letters Patent is hereby corrected as shown below:

In the Specification
Column 10, Line 1, change "segment **114*l*-114*h*" to --segment 114*a*-114*h*--**
Column 18, Line 11, change "angle $θ_R$ In" to --angle $θ_R$. In--

Signed and Sealed this
Sixth Day of September, 2022

Katherine Kelly Vidal
*Director of the United States Patent and Trademark Office*